(12) United States Patent
Shimamura et al.

(10) Patent No.: US 9,617,470 B2
(45) Date of Patent: Apr. 11, 2017

(54) OPTICAL MATERIAL USED IN LIGHT-EMITTING DEVICE, OPTICAL ISOLATOR, AND OPTICAL PROCESSING APPARATUS, AND MANUFACTURING METHOD THEREOF

(71) Applicant: NATIONAL INSTITUTE FOR MATERIALS SCIENCE, Tsukuba-shi, Ibaraki (JP)

(72) Inventors: Kiyoshi Shimamura, Tsukuba (JP); Encarnacion Antonia Garcia Villora, Tsukuba (JP)

(73) Assignee: NATIONAL INSTITUTE FOR MATERIALS SCIENCE, Tsukuba-shi (JP)

( * ) Notice: Subject to any disclaimer, the term of this patent is extended or adjusted under 35 U.S.C. 154(b) by 376 days.

(21) Appl. No.: 14/369,502

(22) PCT Filed: Apr. 27, 2013

(86) PCT No.: PCT/JP2013/062514
§ 371 (c)(1),
(2) Date: Jun. 27, 2014

(87) PCT Pub. No.: WO2013/164991
PCT Pub. Date: Nov. 7, 2013

(65) Prior Publication Data
US 2015/0009562 A1    Jan. 8, 2015

(30) Foreign Application Priority Data

May 1, 2012   (JP) .................................. 2012-104956
May 1, 2012   (JP) .................................. 2012-104957

(51) Int. Cl.
*G02B 5/30*   (2006.01)
*C09K 11/77*   (2006.01)
(Continued)

(52) U.S. Cl.
CPC .......... *C09K 11/7774* (2013.01); *C30B 15/00* (2013.01); *C30B 29/28* (2013.01);
(Continued)

(58) Field of Classification Search
CPC .......... G02B 1/08; G02B 5/30; G02B 5/3025; G02B 6/2746; G02B 6/4208;
(Continued)

(56) References Cited

U.S. PATENT DOCUMENTS

| 4,550,256 A | * | 10/1985 | Berkstresser | ...... C09K 11/7774 |
| | | | | 250/483.1 |
| 2005/0157219 A1 | * | 7/2005 | Sekijima | .................. C30B 13/24 |
| | | | | 349/25 |

(Continued)

FOREIGN PATENT DOCUMENTS

| JP | 2002-293693 A | 10/2002 |
| JP | 2010-155891 A | 7/2010 |

(Continued)

OTHER PUBLICATIONS

International Search Report, dated Jul. 16, 2013, issued in corresponding application No. PCT/JP2013/062514.
(Continued)

*Primary Examiner* — Arnel C Lavarias
(74) *Attorney, Agent, or Firm* — Westerman, Hattori, Daniels & Adrian, LLP

(57) ABSTRACT

An optical material used in a UV-excited yellow light-emitting material and an optical isolator, capable of emitting yellow light stably and highly efficiently even if a large current is fed to obtain the high luminance emission. The optical material used for the UV-excited yellow light-emitting material (2) and the optical isolator (210) is an oxide containing Ce, which is a terbium cerium aluminum garnet type single crystal wherein a part of terbium of a terbium aluminum garnet type single crystal is substituted by cerium. The ratio of number of moles of cerium to the total number of moles of terbium and cerium, namely the composition ratio of cerium, preferably falls within the range from 0.01 mol % to 50 mol %. A part of aluminum may be substituted
(Continued)

by scandium or further by any one of terbium, cerium, yttrium, lutetium, ytterbium, and thulium.

18 Claims, 18 Drawing Sheets

(51) Int. Cl.
*H01L 33/50* (2010.01)
*C30B 29/28* (2006.01)
*C30B 15/00* (2006.01)
*G02F 1/09* (2006.01)
*G02B 5/08* (2006.01)

(52) U.S. Cl.
CPC .......... *G02F 1/093* (2013.01); *H01L 33/502* (2013.01); *G02B 5/08* (2013.01); *H01L 2224/13* (2013.01); *H01L 2224/48091* (2013.01); *H01L 2224/49107* (2013.01); *Y02B 20/181* (2013.01)

(58) Field of Classification Search
CPC .......... G02B 2006/12157; G02B 27/28; G02B 27/286; G02F 1/093; G02F 1/0009; G02F 1/0036
USPC ............ 359/483.01, 484.01, 484.02, 484.03, 359/484.04, 484.1; 252/582, 585; 313/498, 502, 503
See application file for complete search history.

(56) References Cited

U.S. PATENT DOCUMENTS

2006/0133063 A1* 6/2006 Debray .............. C09K 11/7769 362/84
2007/0205712 A1* 9/2007 Radkov .............. C09K 11/0838 313/503
2012/0200920 A1 8/2012 Sanada et al.
2013/0105850 A1 5/2013 Komatsu et al.

FOREIGN PATENT DOCUMENTS

| JP | 2011-213552 A | 10/2011 |
| JP | 2012-001381 A | 1/2012 |
| WO | 2011/049102 A1 | 4/2011 |
| WO | 2012/014439 A1 | 2/2012 |

OTHER PUBLICATIONS

Zorenko, Yu, et al., "Luminescence Properties of Phosphors Based on Tb3Al5O12 (TbAG) Terbium-Aluminum Garnet", Optics and Spectroscopy, 2009, vol. 106, No. 3, pp. 365-374.
Chen, Yibo, et al., "Comparative study on the synthesis, photoluminescence and application in InGaN-based light-emitting diodes of TAG:Ce3+ phosphors", Journal of Solid State Chemistry, 2007, vol. 180, No. 4, pp. 1165-1170.
Chiang, Chien-Chih, et al., "Luminescent Properties of Cerium-Activated Garnet Series Phosphor: Structure and Temperature Effects", Journal of the Electrochemical Society, 2008, vol. 155, No. 6, pp. B517-B6520.
"About high-luminance LED materials", Nikkan Kogyo Shimbun Ltd., 2005, pp. 44, w/partial English translation.
Ye, S., et al., "Phosphors in phosphor-converted white light-emitting diodes: Recent advances in materials, techniques and properties", Materials Science and Engineering R, 2010, vol. 71, pp. 1-34.
Zhang, Wenjing, et al., "Growth and characterization of Tb3Ga5—xAlxO12 single crystal", Journal of Crystal Growth, 2007, vol. 306, pp. 195-199.
Geho, Mikio, "Growth of terbium aluminum garnet (Tb3Al5O12; TAG) single crystals by the hybrid laser floating zone machine", Journal of Crystal Growth, 2004, vol. 267, pp. 188-193.

* cited by examiner (a)

(b)

(c)

OPTICAL MATERIAL USED IN LIGHT-EMITTING DEVICE, OPTICAL ISOLATOR, AND OPTICAL PROCESSING APPARATUS, AND MANUFACTURING METHOD THEREOF

TECHNICAL FIELD

The present invention relates to an optical material and a manufacturing method thereof, and a light-emitting device, an optical isolator, and an optical processing apparatus using the optical material.

BACKGROUND ART

Demand is increasing for phosphors used for illumination, etc. and for optical materials used for optical parts such as optical isolators. In response to an increasing demand for the use of an LED for illumination in recent years, the brightness of light-emitting diode (LED) has been increasing. A high-luminance LED emits high-intensity light and at the same time dissipates a large amount of heat as a result of feeding of a large current. Since each structural member of an LED is exposed to high-intensity light and disposed in hot places for a long period of time, it must have a high resistance to light and heat.

Typical white light-emitting devices (hereinafter referred to as white LEDs) are roughly classified into the following three types (Non-Patent Literature 1). The first type is a white LED wherein a package includes a red light-emitting diode, a green light-emitting diode, and a blue light-emitting diode. Since this type does not require a binding agent (binder) such as epoxy resin in the package, and can thus be constructed using light-emitting diodes only, it can be made to be highly resistant to light and heat. Meanwhile, it is difficult to adjust the brightness and color tone of the three light-emitting diodes, which complicates circuit configuration and thus increases manufacturing cost.

The second type is a white LED wherein a package includes: an ultraviolet (UV) light-emitting diode; and UV-excited red phosphor, UV-excited green phosphor, and UV-excited blue phosphor dispersed in a binding agent (binder), such as epoxy resin, covering the light-emitting diode. The third type is a white LED wherein a package includes: a blue light-emitting diode; and a blue light-excited red phosphor and blue light-excited green phosphor dispersed in a binding agent (binder), such as epoxy resin, covering the light-emitting diode.

The second and the third types have an advantage that the brightness and the color tone can be adjusted more easily than the first type, circuit can be simplified, and thus manufacturing cost can be reduced because they are in a structure wherein only one light-emitting diode is used in a package. Another advantage is that the color temperature adjustment range can be made large. Meanwhile, all of these types are in a structure requiring a binder. As a result of exposure of the binder to intense light and high temperature for a long time, the binder degrades and forms color, thus decreasing the light transmittance and the luminous efficiency, which are disadvantages. Furthermore, when a large current is fed to cause high-luminance emission, not only degradation of the binder but also decrease in characteristics of the phosphors may occur (Non-Patent Literature 2).

The white LEDs are not limited to those of a structure using the three luminescent colors described above. The white LED's may be constructed using two luminescent colors having a complementary color relation, namely the colors positioned opposite to each other with respect to the chromaticity coordinate of white (0.33, 0.33) of the CIE chromaticity coordinate. For example, there is a white LED wherein a package includes a blue light-emitting diode combined with particulate blue light-excited yellow phosphor dispersed in a binding agent (binder) such as epoxy resin (Patent Literature 1). Such a white LED also has a problem that its luminous efficiency decreases due to degradation of the binder.

To solve the problem of the degradation of epoxy resin, an attempt was made to use silicone resin instead, but the problem has yet to be solved completely.

Conventionally, a magnetooptic material, of the optical materials, is also called a Faraday rotator, and is used for an isolator, a circulator, etc. An optical isolator is used for the optical communication. The optical isolator has recently been used also for an optical processing apparatus. The optical processing apparatus is used increasingly to perform marking on metal, welding, and cutting, and consequently, an Yb-doped fiber laser optical processing apparatus having the oscillation wavelength of 1080 nm is becoming the mainstream. The Yb-doped fiber laser is a combination of a laser diode (LD) light source and a fiber amplifier, i.e. the low-power optical output from the LD is amplified by the fiber amplifier.

As a result, the optical isolator that can cut reflection return light having wavelength of 1080 nm efficiently, thus preventing degradation of the light source, and is highly resistant to high-power light is desired. It is necessary for such the optical isolator as followings:
(1) to have a high transmittance of light having wavelength of 1080 nm,
(2) to have a large Faraday rotation angle, and
(3) to be capable of obtaining a large single crystal.
As a material suitable to this wavelength, a terbium gallium garnet (TGG: $Tb_3Ga_5O_{12}$) single crystal has recently been developed and put into practical use (Non-Patent Literature 3).

However, since gallium oxide, namely a raw material component of TGG, evaporates rapidly, it is difficult to increase the crystal size, improve quality, and ensure reproducibility, which was the reason why the cost cannot be decreased. As described in Non-Patent Literature 3, it is therefore desired to develop a material that has a larger Faraday rotation angle (Verdet constant) than TGG and can be produced at low cost. However, a single crystal that satisfies the above-mentioned conditions have yet to be obtained, and TGG only has been used in the market.

To solve the above problems of TGG, the development of a terbium aluminum garnet (TAG: $Tb_3Al_5O_{12}$) single crystal was pursued. As a method of manufacturing TAG, the improved floating zone method (FZ method), which uses the laser as a heating source, is known (Non-Patent Literature 4). The TAG described in Non-Patent Literature 4 is considered superior to TGG because it has a larger Verdet constant than that of TGG. Meanwhile, since it has an inharmonious melting composition (Non-Patent Literature 3), it is difficult to grow a large crystal, which is why it has yet to be put into practical use.

After that, the research has also been conducted on the growth of a terbium scandium aluminum garnet (TSAG: $Tb_3Sc_2Al_3O_{12}$) single crystal, and there is a report that TSAG single crystal is advantageous in increasing crystal size (Patent Literature 2). The TSAG disclosed in Patent Literature 2 has a Verdet constant larger than that of TGG, meaning that a larger single crystal can be grown compared to TAG. However, compared to TGG, it is more difficult to increase the size of the single crystal.

A terbium scandium lutetium aluminum garnet (TSLAG) single crystal was then developed. The TSLAG single crystal has a Faraday rotation angle larger than that of the TGG single crystal, and crystal size was thus increased. However, since the TSLAG single crystal contains Lu, which is expensive, the high cost remains the problem to be solved. Furthermore, although its Faraday rotation angle is larger than that of the TGG single crystal, materials having yet larger Faraday rotation angle are also needed.

CITATION LIST

Patent Literature

Patent Literature 1: JP 2010-155891 A
Patent Literature 2: JP 2002-293693 A

Non-Patent Literature

Non-Patent Literature 1: "About high-luminance LED materials" NIKKAN KOGYO SHIMBUN LTD., p 44 (2005)
Non-Patent Literature 2: Materials Science and Engineering R, 71 (2010) 1-34
Non-Patent Literature 3: Journal of Crystal Growth 306 (2007) 195-199
Non-Patent Literature 4: Journal of Crystal Growth 267 (2004) 188-193

SUMMARY OF INVENTION

Technical Problem

The purpose of the present invention is to provide: a UV-excited yellow light-emitting material capable of emitting yellow light stably and highly efficiently even if a large current is fed to obtain high-luminescence emission; an optical material, such as an optical isolator material which has a high light transmittance in the wavelength range from 500 to 1100 nm, has a larger Faraday rotation angle than those of the TGG single crystal and the TSLAG single crystal, and achieves a cost reduction and a growth of a large and a high-quality single crystal with good reproducibility; and a manufacturing method of the same.

Another purpose of the present invention is to provide a light-emitting device obtaining a long-term, a high-efficiency, and a high-luminance yellow or white light emission, an optical isolator, and an optical processing apparatus.

Solution to Problem

The inventor et al. conducted various experiments repeatedly, and newly developed a cerium-doped terbium scandium aluminum garnet (Ce: TSAG or TCSAG) type single crystal. This single crystal was found to be able to emit the high-luminance yellow light stably, with a UV light used as an excitation light. The present inventors have thought upon the present invention discovering that by combining this single crystal with a UV light-emitting diode, a high luminance, a high efficiency, a simple circuit, and a low manufacturing cost light-emitting device capable of emitting yellow or white light could be provided without using epoxy resin.

Furthermore, the TSLAG developed previously is an excellent crystal as the material for the optical isolator from a viewpoint that it is a Tb-based garnet type single crystal.

The inventor et al. therefore considered that it is necessary to find an element having a larger Faraday rotation angle than Tb in order to develop a material which has a larger Faraday rotation angle than TSLAG and is capable of growing a large single crystal, and found that Ce might have a larger Faraday rotation angle than Tb.

Furthermore, the inventor et al. examined a composition which has Ce in as high concentration as possible and is capable of growing a large single crystal, found a terbium cerium aluminum garnet type single crystal, and concluded that an optical isolator and optical processing apparatus can be provided. The present invention has thus been completed.

The present invention has the following structures in order to achieve the above objectives.

(1) The optical material of the present invention includes an oxide containing Ce.

(2) The optical material of the present invention is preferably a terbium cerium aluminum garnet type single crystal wherein a part of terbium (Tb) of terbium aluminum garnet type single crystal is substituted by cerium (Ce).

(3) It is preferable that the composition ratio of the number of moles of cerium to the total number of moles of terbium and cerium, namely the composition ratio of cerium, is 0.01 mol % or higher but not exceeding 50 mol %.

(4) It is preferable that the composition ratio of cerium of the optical material of the present invention is 5 mol % or lower.

(5) A part of aluminum of the optical material of the present invention may be substituted by scandium.

(6) The part of aluminum or a part of scandium of the optical material of the present invention may be substituted by any one of terbium, cerium, yttrium, lutetium, ytterbium, and thulium, or by two or more of these elements.

(7) The part of aluminum or the part of scandium of the optical material of the present invention may be substituted by a combination of elements exhibiting valences of $2^+$ and $4^+$.

(8) The optical material of the present invention is preferably represented by chemical formula (I) as shown below.

$$((Tb_{1-z}Ce_z)_{1-y}L_y)_a(M_{1-x}N_x)_bAl_cO_{12-w} \quad (I)$$

In the above chemical formula (I): L represents any one of Sc, Y, Lu, Yb, Tm, Mg, Ca, Hf and Zr, or two or more of these elements; M represents Sc; and N represents any one of Tb, Ce, Y, Lu, Yb, Tm, Mg, Ca, Hf, and Zr, or two or more of these elements. a, b, c, x, y, z, and w satisfy the following expressions.

$$2.5 \leq a \leq 3.5 \quad (II)$$

$$0 \leq b \leq 2.5 \quad (III)$$

$$2.5 \leq c \leq 5.5 \quad (IV)$$

$$0 \leq x \leq 1 \quad (V)$$

$$0 \leq y \leq 0.5 \quad (VI)$$

$$0.0001 \leq z \leq 0.5 \quad (VII)$$

$$0 \leq w \leq 0.5 \quad (VIII)$$

(9) A method of manufacturing an optical material of the present invention is a single crystal manufacturing method based on the method of single crystal growth from melt, comprising: heating and dissolving a powder raw material containing at least terbium oxide, aluminum oxide, and cerium oxide; and pulling up a seed crystal from the obtained solution to grow a terbium cerium aluminum garnet type single crystal.

(10) It is preferable that with the method of manufacturing the optical material of the present invention, scandium oxide is further added to the powder raw material, which is then dissolved by heating to prepare a solution.

(11) It is preferable that with the method of manufacturing the optical material of the present invention, the single crystal is grown so that the composition ratio of cerium to the total number of moles of terbium and cerium becomes 5 mol % or lower.

(12) The light-emitting device of the present invention includes: a plate material which uses the optical material described in any one of (1) to (8) above as a UV-excited yellow light-emitting material; and a UV light-emitting diode having a light-emitting surface, wherein the UV-excited yellow light-emitting material is disposed with respect to the UV light-emitting diode so that a surface of the plate material faces the light-emitting surface.

(13) The emission peak wavelength of the UV light-emitting diode preferably falls within the range from 250 nm to 425 nm.

(14) The UV-excited yellow light-emitting material is preferably disposed, contacting the light-emitting surface of the UV light-emitting diode.

(15) The UV-excited yellow light-emitting material is preferably disposed, being apart from the light-emitting surface of the UV light-emitting diode.

(16) It is preferable that a UV-excited blue light-emitting material is disposed, in addition to the UV-excited yellow light-emitting material.

(17) The UV-excited blue light-emitting material is preferably a $Ce:R_2SiO_5$ single crystal (R is any one of Lu, Y, and Gd, or two or more of these elements).

(18) The optical isolator of the present invention has the optical material described in any one of (1) to (8) above, and is either a polarization dependent type or a polarization independent type.

(19) The optical isolator of the present invention is preferably the polarization independent type.

(20) The optical processing apparatus of the present invention includes; the optical isolator described in (18) or (19) above; and a laser light source, wherein the optical isolator is disposed on the optical path of the laser light emitted from the laser light source.

(21) With the optical processing apparatus of the present invention, it is preferable that the oscillation wavelength of the laser light source is 1080 nm.

Advantageous Effects of Invention

The optical material of the present invention can be used as a UV-excited yellow light-emitting material. Since the UV-excited yellow light-emitting material is of a structure of a cerium-doped terbium scandium aluminum garnet type single crystal, stable and high-efficiency yellow light emission is obtained even if a large current is fed to perform high-luminance emission by UV light excitation.

The method of manufacturing the UV-excited yellow light-emitting material of the present invention includes; a process of preparing a powder raw material containing terbium oxide, scandium oxide, aluminum oxide, and cerium oxide; and a process of pulling up a seed crystal out of a solution obtained by dissolving the powder raw material by heating, thereby growing a cerium-doped terbium scandium aluminum garnet type single crystal by the method of crystal growth from melt so that the composition of Ce to the total number of moles of Tb and Ce becomes 5 mol % or lower. A light-emitting material capable of emitting high-luminance yellow light stably, highly efficiently, and for a long time can thus be manufactured.

The light-emitting device of the present invention includes: a plate material made of the UV-excited yellow light-emitting material described above; and a UV light-emitting diode having a light-emitting surface, wherein the UV-excited yellow light-emitting material is disposed with respect to the UV light-emitting diode so that one surface of the plate material and the light-emitting surface face each other. This structure allows the light emitted from the UV light-emitting diode to be introduced to the UV-excited yellow light-emitting material, and allows the light emitted from the UV light-emitting diode to excite the UV-excited yellow light-emitting material, thus causing emission of light. Consequently, according to the light-emitting device of the present invention, the light-emitting device capable of emitting high efficiency and high luminance yellow light for a long time can be provided without using a binder. In addition, since the circuit is simplified, the manufacturing cost can be reduced.

The light-emitting device of the present invention may be further constructed wherein a UV-excited blue light-emitting material is disposed, contacting to the UV-excited yellow light-emitting material. In this case, the light emitted from the UV light-emitting diode excites the UV-excited blue light-emitting material, in addition to the UV-excited yellow light-emitting material, thus causing emission to occur. Consequently, a light-emitting device capable of emitting high efficiency and high luminance white light for a long period of time without using epoxy resin can be provided. In addition, since the circuit can be simplified, manufacturing cost can be reduced.

The optical material of the present invention can also be used as an optical isolator material. Since the optical isolator material of the present invention is the oxide material containing Ce, which has a larger Faraday rotation angle than terbium, and preferably is a single crystal, the Faraday rotation angle can be increased. Furthermore, the material that has a large Faraday rotation angle exceeding that of the TGG single crystal and TSLAG single crystal in the wavelength range from 500 nm to 1100 nm can be obtained. The transmittance in the above wavelength range can also be maintained at 79% or higher. This value can be further increased by performing coating. In addition, the diameter can be increased to 10 mm or larger, and by increasing the diameter of the single crystal having the above characteristics, it can be processed into an optical isolator easily.

The optical isolator material of the present invention is the terbium cerium aluminum garnet type single crystal, wherein a part of terbium (Tb) of the terbium aluminum garnet type single crystal is substituted by cerium (Ce). The Faraday rotation angle of the optical isolator material of the present invention can be increased by allowing it to contain Ce, which has the larger Faraday rotation angle than that of terbium. In addition, the material which has the large Faraday rotation angle exceeding that of the TGG single crystal and TSLAG single crystal in the wavelength range from 500 nm to 1100 nm can be provided. In addition, the transmittance in the above wavelength range can be increased to 79% or higher. This value can be further increased by performing coating. Furthermore, the diameter can be increased to 10 mm or larger, and by increasing the diameter, the crystal can be processed into an optical isolator easily.

The method of manufacturing the optical isolator material of the present invention is the method of manufacturing the single crystal by the method of crystal growth from melt, wherein the powder raw material containing at least terbium oxide, aluminum oxide, and cerium oxide is dissolved by heating, and by pulling up the seed crystal from the obtained solution, the terbium cerium aluminum garnet single crystal is grown. Consequently, the optical isolator material described previously can be produced easily, its mass production is facilitated, and the manufacturing cost can also be reduced. Since the crystal diameter can be increased to 10 mm or larger, the manufacturing cost can be reduced further.

The optical isolator of the present invention, which has the material for the optical isolator described previously, is either the polarization dependent type or the polarization independent type. Consequently, when the Yb-doped fiber laser having oscillation wavelength of 1080 nm, or even the wavelength falling within the range from 500 nm to 1100 nm, is used, the decrease in the power of the laser light source can be prevented by the optical isolator. Furthermore, the Faraday rotation angle exceeding that of the TGG single crystal and the TSLAG single crystal can be obtained in the above wavelength range. Consequently, the optical isolator can be downsized compared to the case where the TGG single crystal or the TSLAG single crystal is used. In addition, since the structure not containing Lu, unlike the TSLAG single crystal, can be obtained, the significant cost reduction can be achieved. Furthermore, since the high-quality single crystal having the large diameter of 10 mm or larger can be provided, the crystal can be processed into the optical isolator.

Owing to the advantages described above, the optical isolator that cuts reflection return light efficiently, thereby preventing degradation of the light source, and has the high resistance to high-power light can be provided.

The optical processing apparatus of the present invention includes: the optical isolator described previously; and the laser light source, wherein the optical isolator is disposed on the light path of the laser light emitted from the laser light source. Consequently, the optical processing apparatus of the present invention can cut reflection return light efficiently, when the Yb-doped fiber laser having oscillation wavelength of 1080 nm is used as the light source, thus preventing degradation of the light source. At the same time, the resistance to high-power light can be maintained high. In addition, by downsizing the optical isolator, the optical processing apparatus can also be downsized.

Figure 1:
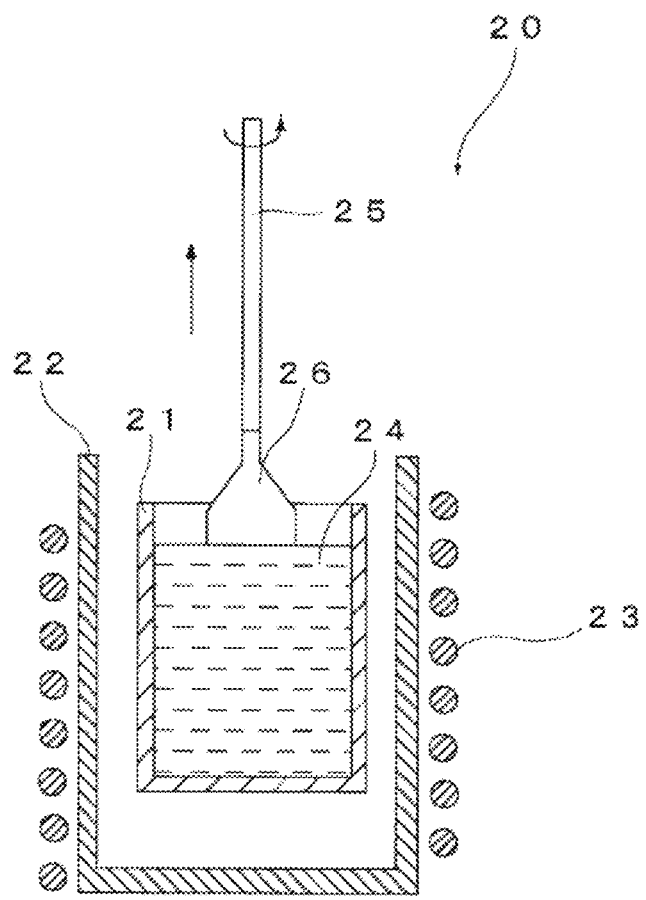
FIG. 1 is a process chart showing a typical manufacturing method of a UV-excited yellow light-emitting material according to the embodiment of the present invention.

REFERENCE SIGNS LIST 1, 1A, 1B, 1C, 1D, 1E, 1F, 1G, 1H, 1J: Light-emitting device
2: UV-excited yellow light-emitting material
2a: First surface
2b: Second surface (light-emitting surface)
3: Ceramic substrate
4, 5: Main body
4A, 5A: Opening
4b: Upper face
6: Transparent substrate
7, 10, 10A: UV light-emitting diode
11: Diode substrate
11a: First main surface
11b: Second main surface (light-emitting surface)
12: n-type AlGaN: Si layer
13: Emission layer
14: p-type AlGaN: Mg layer
15A: n-side electrode
15B: p-side electrode
16: Bump
20: Crystal pulling furnace
21: Crucible
22: Cylindrical vessel
23: High-frequency coil
24: Solution
25: Seed crystal
26: Grown crystal
31, 32: Wiring part
40, 50: Reflecting surface
51: Retaining member
61, 62: Wiring part 70: $Ga_2O_3$ substrate
71: Buffer layer
72: $n^+$-GaN layer
73: n-AlGaN layer
74: Multiple-quantum well (MQW) layer
75: p-AlGaN layer
76: $p^+$-GaN layer
77: p electrode
78: n electrode
95, 96, 97: UV-excited blue light-emitting material
121, 122: UV-excited yellow light-emitting material
121a, 122a: First surface
121b, 122b: Second surface
140: Transparent electrode
140b: Surface (light-emitting surface)
201: Polarizer
202: Analyzer
203: Optical isolator material (Faraday rotator)
210: Optical isolator
211: Laser light source
220: Optical processing apparatus
311, 321, 611, 621: Bonding wire
L: Laser beam
P: Optical path
Q: Body to be processed

DESCRIPTION OF EMBODIMENTS

The present invention will hereinafter be described in detail by referring to some embodiments and examples.

First Embodiment

UV-Excited Yellow Light-Emitting Material

First, a UV-excited yellow light-emitting material as an optical material in the embodiment of the present invention will be described.

The UV-excited yellow light-emitting material in the embodiment of the present invention is a cerium-doped terbium scandium aluminum garnet type single crystal (hereinafter also referred to as Ce: TSAG or TCSAG type single crystal).

It is preferable that in the UV-excited yellow light-emitting material in the embodiment of the present invention, Ce is added at the composition ratio to the total number of moles of terbium (Tb) and cerium (Ce) of 5 mol % or lower. Consequently, the yellow light-emitting material having the excitation peak wavelength in the range from 250 to 425 nm and the emission peak wavelength in the range from 500 to 630 nm can be provided. By combining the UV-excited yellow light-emitting material with a UV light-emitting diode having emission peak wavelength in the range from 250 to 425 nm, a high luminance and a high efficiency yellow light-emitting device can be provided.

In the UV-excited yellow light-emitting material in the embodiment of the present invention, a part of scandium (Sc) may be substituted by any one of terbium, cerium, yttrium (Y), lutetium (Lu), ytterbium (Yb), and thulium (Tm), or by two or more of these elements. In addition, a part of the scandium may be substituted by a combination of elements exhibiting valences of $2^+$ and $4^+$. Even so, the yellow light-emitting material having the excitation peak wavelength within the range from 250 to 425 nm and the emission peak wavelength within the range from 500 to 630 nm can be provided.

It is preferable that the UV-excited yellow light-emitting material in the embodiment of the present invention is represented by chemical formula (I).

$$((Tb_{1-z}Ce_z)_{1-y}L_y)_a(M_{1-x}N_x)_bAl_cO_{12-w} \quad (I)$$

In the above formula (I); L represents any one of Sc, Y, Lu, Yb, Tm, Mg (magnesium), Ca (calcium), Hf (hafnium) and Zr (zirconium), or two or more of these elements; M represents Sc; and N represents any one of Tb, Ce, Y, Lu, Yb, Tm, Mg, Ca, Hf, and Zr, or two or more of these elements. a, b, c, x, y, z, and w satisfy the following expressions.

$$2.5 \leq a \leq 3.5 \quad (II)$$

$$0 \leq b \leq 2.5 \quad (III)$$

$$2.5 \leq c \leq 5.5 \quad (IV)$$

$$0 \leq x \leq 1 \quad (V)$$

$$0 \leq y \leq 0.5 \quad (VI)$$

$$0.0001 \leq x \leq 0.5 \quad (VII)$$

$$0 \leq w \leq 0.5 \quad (VIII)$$

By allowing a, b, c, x, y, z, and w to fall within the above range, an occurrence of defects such as cracks at the time of growing a single crystal can be suppressed. In addition, the yellow light-emitting material having the excitation peak wavelength within the range from 250 to 425 nm and the emission peak wavelength within the range from 500 to 630 nm can be provided, and the high-luminance and the high-efficiency yellow light emission is obtained by excitation of UV light.

As far as the composition ratio of Ce to the total number of moles of Tb and Ce falls within the range of 5 mol % or lower, by adding Ce to Tb, the yellow light emission is obtained, and the fluorescence intensity can thus be increased significantly. Meanwhile, when the composition ratio of Ce exceeds 5 mol %, the fluorescence intensity decreases by concentration quenching.

<Method of Manufacturing a UV-Excited Yellow Light-Emitting Material>

Now, a method of manufacturing a UV-excited yellow light-emitting material according to the embodiment of the present invention will be described.

FIG. 1 is a process chart showing a typical manufacturing method of the UV-excited yellow light-emitting material. In FIG. 1, a crystal pulling furnace 20 used for growing the UV-excited yellow light-emitting material (single crystal) is shown. The crystal pulling furnace 20 includes: a crucible 21 made of iridium (Ir); a ceramic cylindrical vessel 22 for housing the crucible 21; and a high-frequency coil 23 wound around the cylindrical vessel 22, as major components. The high-frequency coil 23 generates induced current in the crucible 21 to heat the crucible 21.

Figure 2:
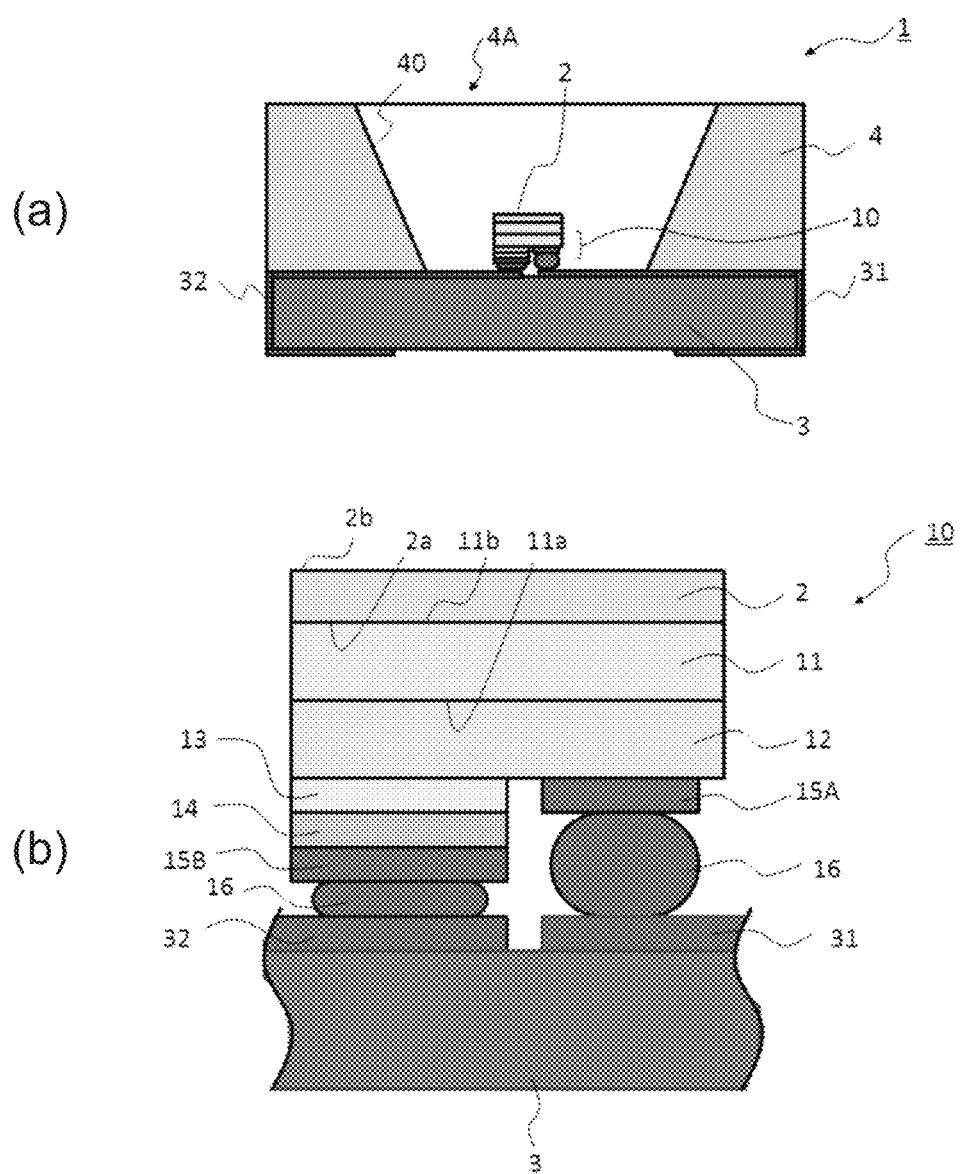
FIG. 2 is a schematic diagram of a light-emitting device according to a first embodiment of the present invention, wherein (a) is a cross-sectional view of the light-emitting device and (b) is a cross-sectional view of a light-emitting diode constituting the light-emitting device and its surrounding part.

By using the crystal pulling furnace 20, the UV-excited yellow light-emitting material 2 (as shown in FIG. 2), which is the garnet type single crystal, is grown by the method of crystal growth from melt. First, $Tb_4O_7$ powder, $Sc_2O_3$ powder, $Al_2O_3$ powder, and $CeO_2$ powder are mixed by wet mixing at the mixing ratio based on the composition of a single crystal to be grown, and then dried to prepare a powder raw material. To this powder raw material, at least a type of another powder raw material may be further mixed as required. Mixing may be performed by dry mixing instead of wet mixing.

The powder raw material is packed into the crucible 21. The high-frequency current is applied to the high-frequency coil 23 to heat the crucible 21, thereby increasing the temperature of the powder raw material in the crucible 21 from a room temperature to a temperature level where the powder raw material can be dissolved. The powder raw material is thus dissolved, and a solution 24 is obtained.

Then a seed crystal 25, which is used as a rod-shaped crystal pulling shaft, is prepared. As the seed crystal 25, the garnet type single crystal such as yttrium aluminum garnet (YAG) can be used.

After the tip of the seed crystal 25 is made to contact the solution 24, the seed crystal 25 is pulled up at a specified pulling speed while being rotated at a specified number of revolutions. The number of revolutions of the seed crystal 25 preferably falls within the range from 3 to 50 rpm, and more preferably within the range from 3 to 10 rpm. The seed crystal 25 pulling speed preferably falls within the range from 0.1 to 10 mm/h, and more preferably within the range from 0.5 to 3 mm/h. It is preferable that pulling of the seed crystal 25 is performed in an inert gas atmosphere. As the inert gas, Ar, nitrogen, etc. can be used. A trace amount of oxygen may be mixed. To place the seed crystal 25 in the inert gas atmosphere, it is only necessary to feed the inert gas into a tightly-closed housing at a specified flow rate while discharging it from there.

By pulling up the seed crystal 25 under the condition described above, a grown crystal 26 in bulk state can be obtained at the tip of the seed crystal 25. The grown crystal 26 is a cerium-doped terbium scandium aluminum garnet type single crystal wherein a part of Tb is substituted by Ce, namely a single crystal represented by chemical formula (I) as shown above, and the UV-excited yellow light-emitting material 2, 121, 122 (See FIGS. 2, 3, and 4 as described later) in the embodiment of the present invention.

By following the process described above, the grown crystal 26, namely the UV-excited yellow light-emitting material 2, 121, 122 in the embodiment of the present invention, can be produced easily. At the same time, this method of crystal growth from melt can increase the size of the grown crystal 26 easily.

<Light-Emitting Device>

A light-emitting device in a first embodiment of the present invention will then be described.

FIG. 2 is a schematic diagram of a light-emitting device 1 in a first embodiment of the present invention, where (a) is a cross-sectional view of the light-emitting device 1, and (b) is a cross-sectional view of a UV light-emitting diode 10 constituting the light-emitting device 1 and surrounding part.

As shown in FIG. 2 (a), the light-emitting device 1 is roughly made up of including: a ceramic substrate 3; a UV light-emitting diode (UV-LED) 10 disposed on the ceramic substrate 3; and a main body 4 in a form of a wall provided around the UV light-emitting diode 10 on the ceramic substrate 3. The ceramic substrate 3 is a member in a shape of a plate made of a ceramic material such as $Al_2O_3$. On the surface of the ceramic substrate 3, wiring parts 31, 32 made of a metal such as tungsten are formed by pattern formation. The main body 4 is a member made of white resin formed on the ceramic substrate 3, and an opening 4A is formed at its center. The opening 4A is formed in a tapered shape, the size of the opening gradually increasing from the side of the ceramic substrate 3 toward outside. The inner surface of the opening 4A is a reflecting surface 40 for reflecting the light from the UV light-emitting diode 10 toward outside.

As shown in FIG. 2 (b), in the UV light-emitting diode 10, an n-side electrode 15A and a p-side electrode 15B are mounted to the wiring parts 31, 32 of the ceramic substrate 3 via bumps 16, 16, thereby electrically connecting.

<UV Light-Emitting Diode>

As the UV light-emitting diode 10, a flip-chip type diode capable of emitting ultraviolet (UV) light having an emission peak wavelength within the range from 250 to 425 nm is used. As its material, an AlGaN system compound semiconductor can be used.

As shown in FIG. 2 (b), on a first main surface 11a of the diode substrate 11 made of sapphire, etc. of the UV light-emitting diode 10, an n-type AlGaN: Si layer 12 is formed via a buffer layer and $n^+$-GaN: Si layer, an AlGaN emission layer 13 of a multiple-quantum well structure is formed, and then a p-type AlGaN: Mg layer 14 is formed via a $p^+$-GaN: Mg layer on the side of the p-type electrode, in this order. The electrode 15A on n side is formed on an exposed part of the n-type AlGaN: Si layer 12, and the electrode 15B on p side is formed on the surface of the p-type AlGaN: Mg layer 14.

As a result of injecting carriers from the n-type AlGaN: Si layer 12 and the p-type AlGaN: Mg layer 14, the emission layer 13 emits the UV light. This UV light penetrates the n-type AlGaN: Si layer 12 and the diode substrate 11, and is then emitted from the second main surface 11b of the diode substrate 11. In other words, the second main surface 11b of the diode substrate 11 is a light-emitting surface of the light-emitting diode 10. Note that the light-emitting surface is a surface of the UV light-emitting diode, on which light is emitted from inside to outside of the diode. In particular, it is the surface that the amount of light emitted is large.

The UV-excited yellow light-emitting material 2 according to the embodiment of the present invention is disposed, contacting the second main surface 11b of the diode substrate 11, which is the light-emitting surface of the UV light-emitting diode 10 to cover the entire area of the second main surface 11b.

Since the UV-excited yellow light-emitting material 2 according to the embodiment of the present invention is the single crystal in a shape of a flat plate, the first surface 2a facing the diode substrate 11 can be fixed directly to the diode substrate 11, without inserting epoxy resin between the first surface and the second main surface 11b of the diode substrate 11. The methods of fixing the UV-excited yellow light-emitting material 2 include a method of fixing it using a metal piece etc. The single crystal in this case is defined as the one which has a size the same as or larger than the second main surface 11b and is practically regarded as the single crystal as a whole. By fixing the first surface 2a to the diode substrate 11 by allowing that the first surface to directly contact the diode substrate 11, without inserting epoxy resin between the first surface and the second main surface 11b of the diode substrate 11, the light from the UV light-emitting diode 10 can be introduced to the UV-excited yellow light-emitting material 2 while the loss of light is minimized. Consequently, the luminous efficiency of the UV-excited yellow light-emitting material 2 can be improved.

<Luminescence Mechanism of the Light-Emitting Device>

In the light-emitting device 1 according to the first embodiment as shown in FIG. 2, when the UV light-emitting diode 10 is energized, electrons are injected into the emission layer 13 via the wiring part 31, the n-side electrode 15A, and the n-type AlGaN: Si layer 12. Holes are injected into the emission layer 13 via the wiring part 32, the p-side electrode 15B, and the p-type AlGaN: Mg layer 14, and thus the emission layer 13 emits the UV light. The UV light from the emission layer 13 penetrates the n-type AlGaN: Si layer 12 and the diode substrate 11, is emitted from the second main surface 11b of the diode substrate 11, and introduced to the first surface 2a of the UV-excited yellow light-emitting material 2.

The UV light entering from the first surface 2a excites the UV-excited yellow light-emitting material 2 as an excitation light. The UV-excited yellow light-emitting material 2 absorbs the UV light from the UV light-emitting diode 10, and performs wavelength conversion so that the absorbed UV light is converted into yellow light having the emission peak wavelength in the range from 500 to 630 nm, for example. Thus, the light-emitting device 1 can emit the yellow light.

Since the light-emitting device 1 according to the first embodiment has a structure where the single-crystal UV-excited yellow light-emitting material 2 in the shape of the flat plate is used and a binder for retaining particulate phosphors such as epoxy resin is not used, the degradation of the binder, the degradation due to irradiation of high-power excitation light in particular, can be suppressed, and consequently the decrease in luminous efficiency can be suppressed. In addition, compared to the case where a large number of particulate phosphors are combined, the surface area of the single-crystal UV-excited yellow light-emitting material 2 in the shape of the flat plate can be made small, thus allowing degradation in characteristics due to the effect of the external environment to be suppressed. Since the single-crystal consisting of the UV-excited yellow light-emitting material 2 in the form of the flat plate is used, the quantum efficiency of the UV-excited yellow light-emitting material 2 can be improved, and the luminous efficiency of the light-emitting device can be increased. Since the light-emitting device 1 according to the first embodiment uses the Ce: TSAG type single crystal as the UV-excited yellow light-emitting material 2, the UV light from the UV light-emitting diode can be made to be absorbed by the UV-excited yellow light-emitting material 2 efficiently, and thus the high luminance yellow light can be emitted with high quantum efficiency.

Second Embodiment

A second embodiment of the present invention will then be described.

Figure 3:
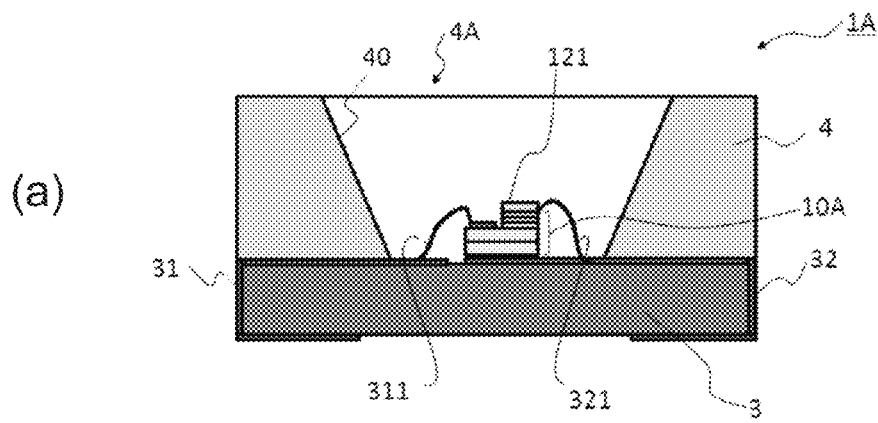
FIG. 3 is a schematic diagram of the light-emitting device according to a second embodiment, wherein (a) is a cross-sectional view of the light-emitting device, (b) is a cross-sectional view of a light-emitting diode constituting the light-emitting device and surrounding part, and (c) is a plan view of the light-emitting diode constituting the light-emitting device.
Figure 3:
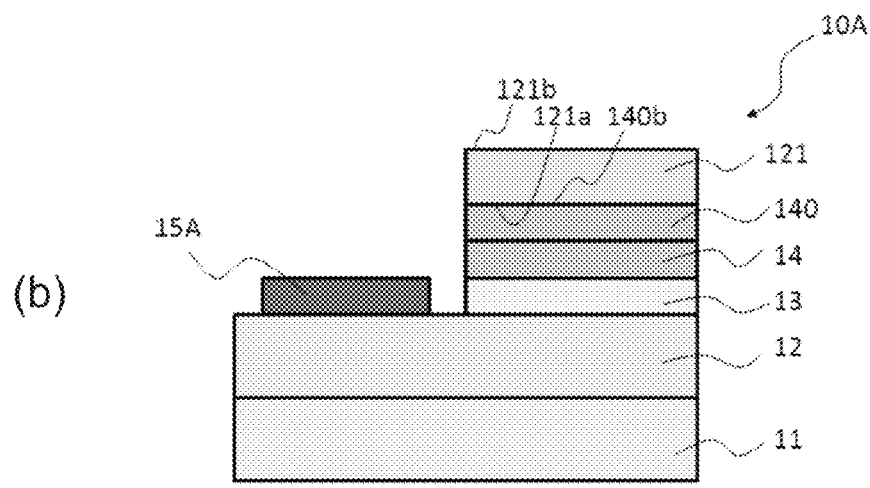
Figure 3:
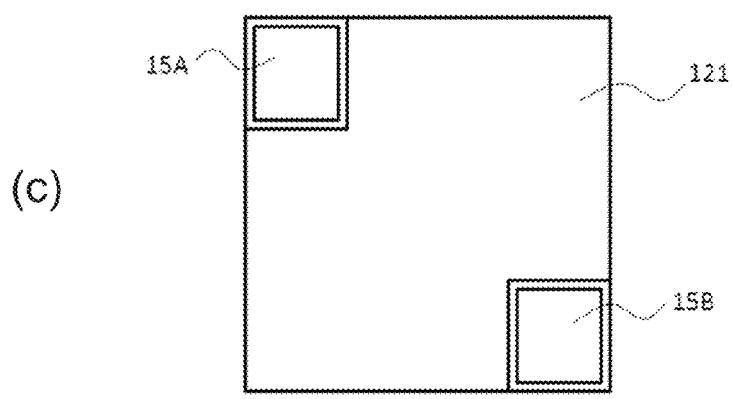

FIG. 3 is a schematic diagram of a light-emitting device 1A according to a second embodiment, where (a) is a cross-sectional view of the light-emitting device 1A, (b) is a cross-sectional view of a UV light-emitting diode 10A constituting the light-emitting device 1A and its surrounding part, and (c) is a plan view of the UV light-emitting diode 10A.

The structure of the light-emitting device 1A in the second embodiment, wherein the light emitted from the UV light-emitting diode 10A is introduced to a single-crystal UV-excited yellow light-emitting material 121 and the wavelength conversion is performed, is the same as the light-emitting device 1 according to the first embodiment. Meanwhile, the structure of the UV light-emitting diode 10A and the position of placement of the UV-excited yellow light-emitting material 121 with respect to the UV light-emitting diode are different from those of the first embodiment. The description of the components of the light-emitting device 1A having the same function and structure as those of the light-emitting device in the first embodiment will be omitted, with the same signs allotted to them, and different structures only will mainly be described.

As shown in FIGS. 3 (a) and (b), the diode substrate 11 of the UV light-emitting diode 10A in the light-emitting device 1A is disposed so that it faces a ceramic substrate 3. In addition, a Ce: TSAG single-crystal UV-excited yellow light-emitting material 121 is connected to the side of the opening 4A of the UV light-emitting diode 10A. As the UV-excited yellow light-emitting material 121, the material having the same composition described in the embodiment of the present invention can be used.

As shown in FIGS. 3 (b) and (c), the UV light-emitting diode 10A includes: the diode substrate 11; the n-type AlGaN: Si layer 12; the emission layer 13; and the p-type AlGaN: Mg layer 14. Furthermore, the UV light-emitting diode 10A also includes a transparent electrode 140 consisting of such as indium tin oxide (ITO) on the p-type AlGaN: Mg layer 14. On the transparent electrode 140, the p-side electrode 15B (as shown in FIG. 3 (c)) is formed. Carriers injected from the p-side electrode 15B are diffused into the transparent electrode 140 and injected into the p-type AlGaN: Mg layer 14.

As shown in FIG. 3 (c), a UV-excited yellow light-emitting material 121 is formed in a shape of a rough square having cutouts at places corresponding to the p-side electrode 15B and the n-side electrode 15A, which is formed on the n-type AlGaN: Si layer 12. The composition of the UV-excited yellow light-emitting material 121 is the same as that of the UV-excited yellow light-emitting material according to the embodiment of the present invention.

As shown in FIG. 3 (a), the n-side electrode 15A of the UV light-emitting diode 10A is connected to the wiring part 31 of the ceramic substrate 3 by a bonding wire 311, whereas the p-side electrode 15B of the UV light-emitting diode 10A is connected to the wiring part 32 of the ceramic substrate 3 by a bonding wire 321.

When the UV light-emitting diode 10A structured as described above is energized, electrons are injected into the emission layer 13 via the wiring part 31, the n-side electrode 15A, and the n-type AlGaN: Si layer 12. Holes are also injected to the emission layer 13 via the wiring part 32, the p-side electrode 15B, the transparent electrode 140, and the p-type AlGaN: Mg layer 14, and the emission layer 13 emits the UV light.

The UV light from the emission layer 13 penetrates the p-type AlGaN: Mg layer 14 and the transparent electrode 140, and is emitted from the surface 140b of the transparent electrode 140. Namely, the surface 140b of the transparent electrode 140 is the light-emitting surface of the UV light-emitting diode 10A. The light emitted from the surface 140b of the transparent electrode 140 is introduced to the first surface 121a of the UV-excited yellow light-emitting material 121.

The UV light introduced from the first surface 121a to the UV-excited yellow light-emitting material 121 excites the UV-excited yellow light-emitting material 121 as an excitation light. The UV-excited yellow light-emitting material 121 absorbs the UV light from the UV light-emitting diode 10A and converts the wavelength of the absorbed light mainly into a wavelength of yellow light. More specifically, the UV-excited yellow light-emitting material 121 is excited by the UV light from the light-emitting diode 10A having an emission peak wavelength falling within the range from 250 to 425 nm, and emits the yellow light having the emission peak wavelength falling within the range from 500 to 630 nm. As described above, the light-emitting device 1A emits the yellow light. The same function and effect as those in the first embodiment can be obtained also by this embodiment.

Third Embodiment

A third embodiment of the present invention will then be described.

Figure 4:
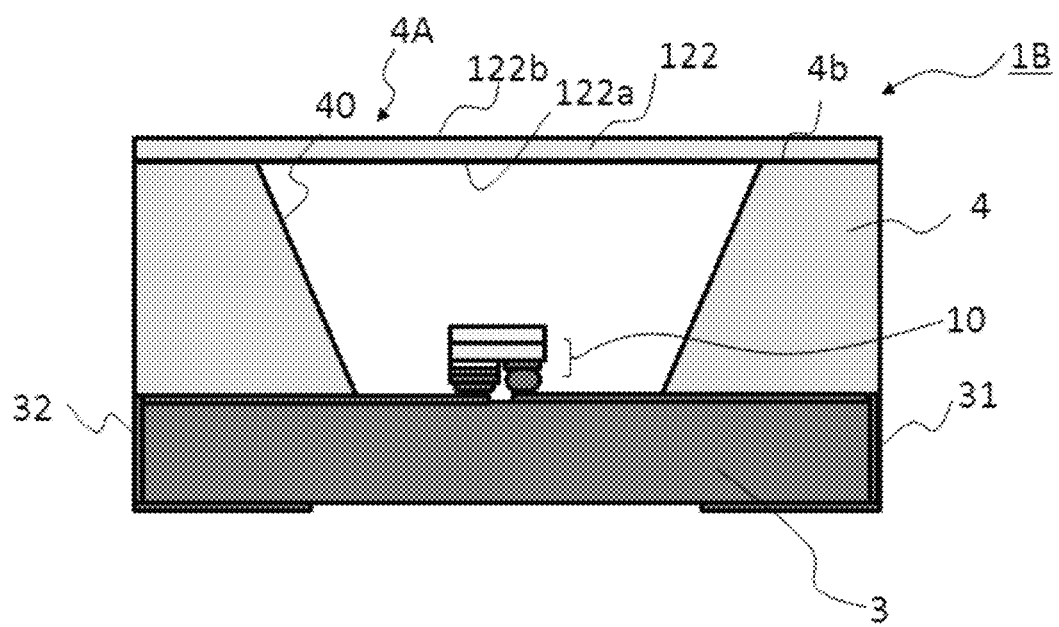
FIG. 4 is a cross-sectional view of the light-emitting device according to a third embodiment.

FIG. 4 is a cross-sectional view of a light-emitting device 1B according to a third embodiment. In this light-emitting device 1B, the structure, where the light emitted from the UV light-emitting diode 10 is introduced to a single-crystal UV-excited yellow light-emitting material 122 and wavelength conversion is performed, is the same as the light-emitting device 1 according to the first embodiment. However, the position of placement of the UV-excited yellow light-emitting material 122 is different from that in the first embodiment. The description of the components of the light-emitting device 1B having the same function and structure as those of the light-emitting device in the first or the second embodiment will be omitted, with the same signs allotted to them, and different structures only will mainly be described.

As shown in FIG. 4, the light-emitting device 1B has the UV light-emitting diode 10 in the same structure as the first embodiment on the ceramic substrate 3. The UV light-emitting diode 10 emits UV light from the second main surface 11b of the diode substrate 11 (FIG. 2 (b)) placed on the side of the opening 4A of the main body 4 toward the side of the opening 4A of the main body 4.

To the main body 4, the UV-excited yellow light-emitting material 122 is bonded, covering the opening 4A. The UV-excited yellow light-emitting material 122 is formed in a shape of a flat plate, and bonded to the upper surface 4b of the main body 4. As the UV-excited yellow light-emitting material 122, materials having compositions described in the embodiment of the present invention can be used. Furthermore, the UV-excited yellow light-emitting material 122 actually is larger than the UV light-emitting diode 10, and its entire body forms the single crystal.

When the light-emitting device 1B constructed as described above is energized, the UV light-emitting diode 10 becomes luminous and emits UV light from the second main surface 11b toward the UV-excited yellow light-emitting material 122. The UV-excited yellow light-emitting material 122 takes in the UV light of the light-emitting element 10 from the first surface 122a facing the light-emitting surface of the UV light-emitting diode 10, and emits yellow light obtained by the excitation of this UV light to outside from a second surface 122 b. As described above, the light-emitting device 1B emits the yellow light.

With this embodiment also, the same function and effect as those described in the first embodiment can be obtained. Since the UV light-emitting diode 10 and the UV-excited yellow light-emitting material 122 are placed apart from each other, the large UV-excited yellow light-emitting material 122 can be used, unlike the case where the UV-excited yellow light-emitting material is bonded to the light-emitting surface of the UV light-emitting diode 10. The assembly of the light-emitting device 1B can thus be facilitated.

Fourth Embodiment

A fourth embodiment of the present invention will then be described.

Figure 5:
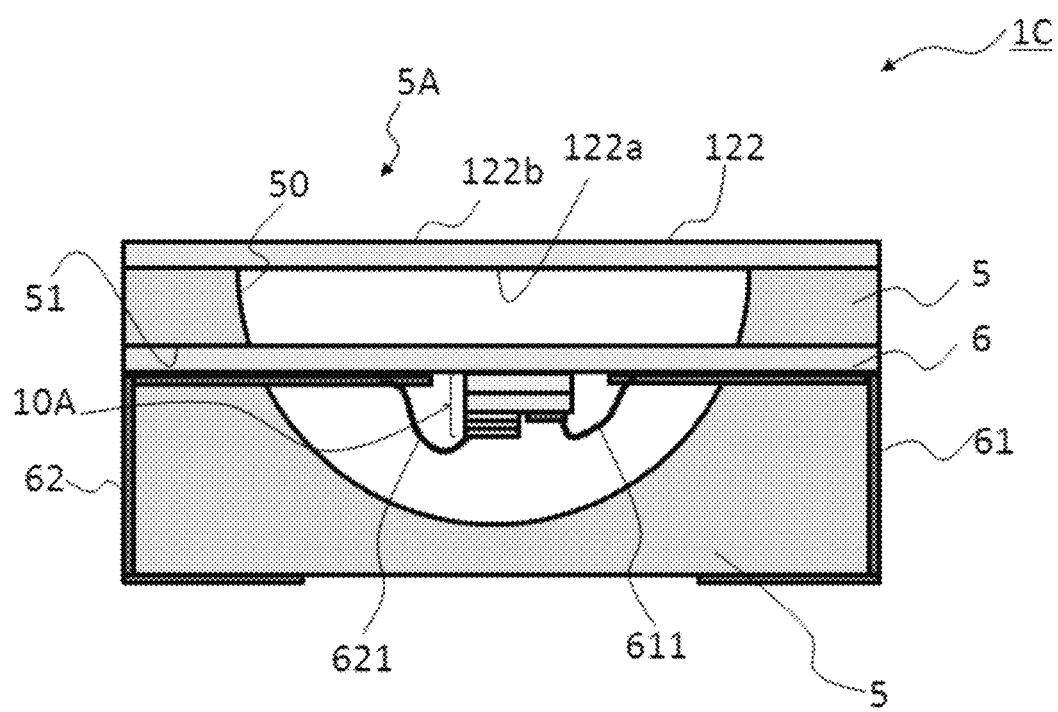
FIG. 5 is a cross-sectional view of the light-emitting device according to a fourth embodiment.

FIG. 5 is a cross-sectional view of a light-emitting device 1C according to a fourth embodiment. As shown in FIG. 5, with this light-emitting device 1C, the positional relation among the UV light-emitting diode 10A, a substrate 6 to which the UV light-emitting diode 10A is mounted, and the UV-excited yellow light-emitting material 122 are different from those in the third embodiment. The description of the components of the light-emitting device 1C having the same function and structure as those of the light-emitting device in the first, second, or the third embodiments will be omitted, with the same signs allotted to them, and different structures only will mainly be described.

The light-emitting device 1C according to the fourth embodiment includes: a main body 5 made of white resin; a transparent substrate 6 retained at a slitted retaining member 51 formed in the main body 5; the UV-excited yellow light-emitting material 122, namely a Ce: TSAG single crystal, disposed so that it covers the opening 5A of the main body 5; a UV light-emitting diode 10A mounted on the surface of the transparent substrate 6 on the side opposite to the UV-excited yellow light-emitting material 122; and wiring parts 61, 62 for energizing the UV light-emitting diode 10A. The composition of the UV-excited yellow light-emitting material 122 is the same as that of the UV-excited yellow light-emitting material according to the embodiment of the present invention.

At the center of the main body 5, a concave having a curved surface is formed, and the surface of this concave is a reflecting surface 50 for reflecting the light emitted from the UV light-emitting diode 10A toward the side of the UV-excited yellow light-emitting material 122. The transparent substrate 6 is made of translucent resin such as silicone resin, acrylic resin, and PET, glassy substance, or a single crystal or polycrystal translucent member such as sapphire, ceramic, quartz, and AlN. The transparent substrate 6 has translucency for transmitting the UV light from the UV light-emitting diode 10A and insulation property. To the transparent substrate 6, a part of the wiring parts 61, 62 is bonded. The n-side electrode and p-side electrode of the UV light-emitting diode 10A and one end of the wiring parts 61, 62 are electrically connected by bonding wires 611, 621.

When the light-emitting device 1C structured as described above is energized, the UV light-emitting diode 10A becomes luminous and a part of the UV light penetrates the transparent substrate 6 and is introduced to the first surface 122a of the UV-excited yellow light-emitting material 122. Also, the other part of the UV light is reflected by the reflecting surface 50 of the main body 5, penetrates the transparent substrate 6, and is introduced to the first surface 122a of the UV-excited yellow light-emitting material 122. The UV light introduced to the UV-excited yellow light-emitting material 122 is absorbed by the UV-excited yellow light-emitting material 122, and undergoes wavelength conversion. As described above, the light-emitting device 1C emits the yellow light obtained by wavelength conversion performed by the UV-excited yellow light-emitting material 122.

The same effect as that in the third embodiment can be obtained by this embodiment also. In addition, since the light emitted from the UV light-emitting diode 10A to the side opposite to the side of the UV-excited yellow light-emitting material 122 is reflected by the reflecting surface 50, penetrates the transparent substrate 6, and then is introduced to the UV-excited yellow light-emitting material 122, the light extraction efficiency of the light-emitting device 1C increases.

Fifth Embodiment

A fifth embodiment of the present invention will then be described.

Figure 6:
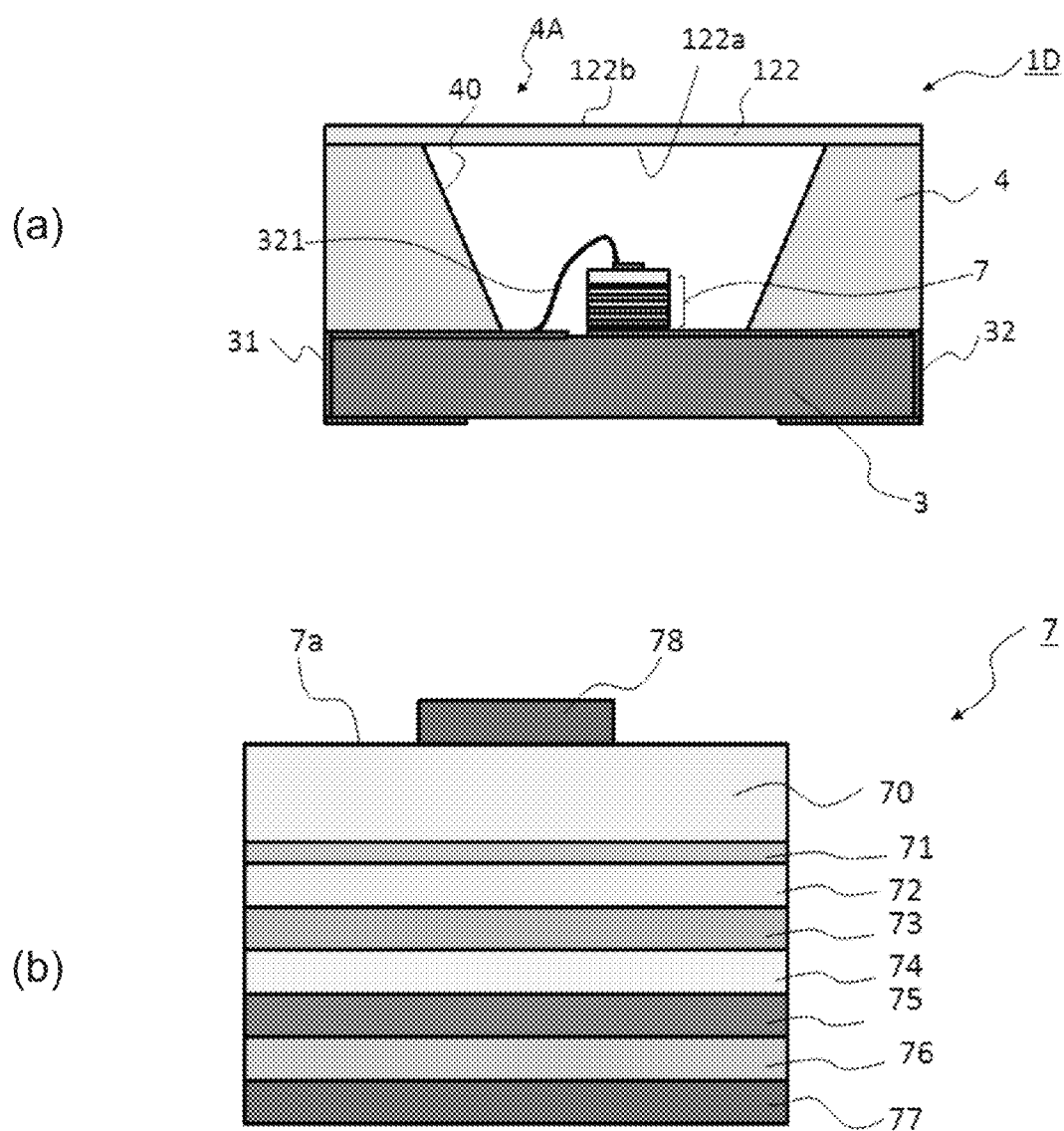
FIG. 6 is a schematic diagram of the light-emitting device according to a fifth embodiment, wherein (a) is a cross-sectional view of the light-emitting device, and (b) is a cross-sectional view of the light-emitting diode constituting the light-emitting device.

FIG. 6 is a schematic diagram of a light-emitting device 1D according to a fifth embodiment, where (a) is a cross-sectional view of the light-emitting device 1D, and (b) is a cross-sectional view of a UV light-emitting diode 7 constituting the light-emitting device 1D.

As shown in FIG. 6 (a), the structure and the placement of the UV light-emitting diode 7 in this light-emitting device 1D are different from those in the third embodiment. The description of the components of the light-emitting device 1D having the same function and structure as those of the light-emitting device in the first, second, or third embodiment will be omitted, with the same signs allotted to them, and different structures only will mainly be described.

In the light-emitting device 1D, the UV light-emitting diode 7 is disposed on the wiring part 32 provided on the ceramic substrate 3.

As shown in FIG. 6 (b), the UV light-emitting diode 7 is formed by depositing a $\beta$-Ga$_2$O$_3$ substrate 70, a buffer layer 71, a Si-doped n$^+$-GaN layer 72, a Si-doped n-AlGaN layer 73, a multiple-quantum well (MQW) layer 74, a Mg-doped p-AlGaN layer 75, a Mg-doped p$^+$-GaN layer 76, and a p-electrode 77 in this order. An n-electrode 78 is provided on the surface of the $\beta$-Ga$_2$O$_3$ substrate 70 opposite to the buffer layer 71.

The $\beta$-Ga$_2$O$_3$ substrate 70 is made of $\beta$-Ga$_2$O$_3$ exhibiting the n-type conductivity. The MQW layer 74 is an Al$_a$Ga$_{1-a}$N/Al$_b$Ga$_{1-b}$N (a, b are different numbers larger than 0) emission layer having a multiple-quantum well structure. The p-electrode 77 is an indium tin oxide (ITO) transparent electrode and is electrically connected to the wiring part 32. The n-electrode 78 is connected to the wiring part 31 of the ceramic substrate 3 by the bonding wire 321. As the diode substrate, SiC may be used instead of $\beta$-Ga$_2$O$_3$.

When the UV light-emitting diode 7 structured as described above is energized, electrons are injected into the MQW layer 74 via the n-electrode 78, the $\beta$-Ga$_2$O$_3$ substrate 70, the buffer layer 71, the n$^+$-GaN layer 72, and the n-AlGaN layer 73. Meanwhile, holes are injected into the MQW layer 74 via the p-electrode 77, the p$^+$-GaN layer 76, and the p-AlGaN layer 75, and consequently the UV light is emitted. This UV light penetrates the $\beta$-Ga$_2$O$_3$ substrate 70, etc., is emitted from a light-emitting surface 7a of the UV light-emitting diode 7, and introduced into the first surface 122a of the UV-excited yellow light-emitting material 122. The UV-excited yellow light-emitting material 122 takes in the UV light from the UV light-emitting diode 7 via the first surface 122a facing the light-emitting surface of the UV light-emitting diode 7, and emits yellow light excited by this UV light from the second surface 122b to outside. The light-emitting device 1D emits the yellow light as described above. The same function and effect as those in the third embodiment can be obtained in this embodiment also.

Sixth Embodiment

A sixth embodiment of the present invention will then be described.

Figure 7:
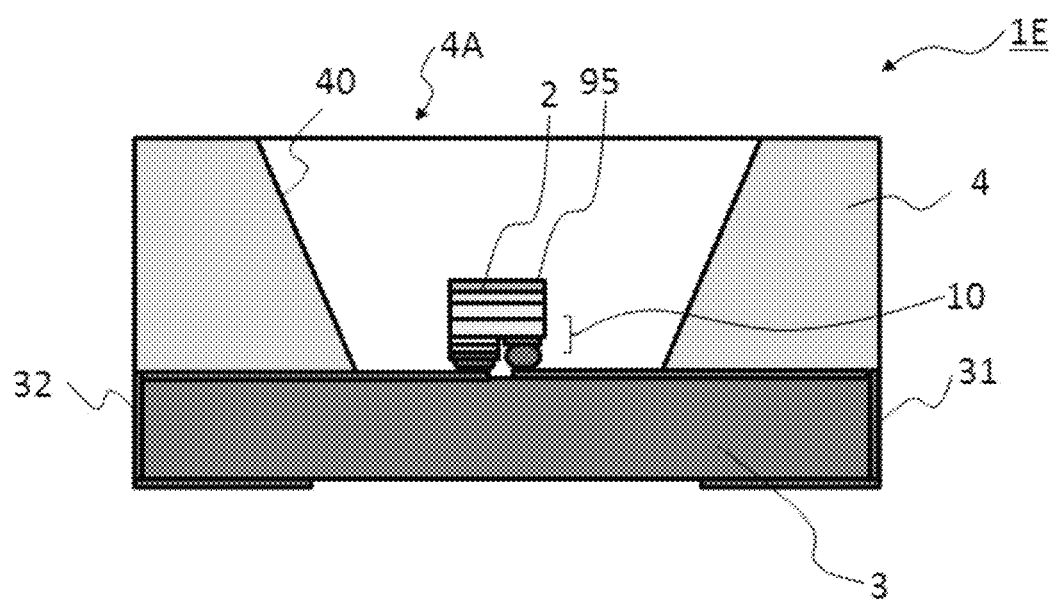
FIG. 7 is a cross-sectional view of the light-emitting device according to a sixth embodiment.

FIG. 7 is a cross-sectional view of a light-emitting device 1E according to a sixth embodiment. As shown in FIG. 7, this embodiment is the same as the composition of the first embodiment, except that a UV-excited blue light-emitting material 95 is disposed on the UV-excited yellow light-emitting material 2 on the UV light-emitting diode 10. The description of the components of the light-emitting device having the same function and structure as those of the light-emitting device described previously will be omitted, with the same signs allotted to them, and different structures only will mainly be described.

In this light-emitting device 1E, the UV-excited blue light-emitting material 95 is disposed on the UV-excited yellow light-emitting material 2 on the UV light-emitting diode 10. This structure allows the UV-excited yellow light-emitting material 2 to emit yellow light by a part of the UV light from the UV light-emitting diode 10, while the UV-excited blue light-emitting material 95 emits blue light by the rest of the UV light from the UV light-emitting diode 10. Since the blue color and the yellow color are in complementary color relation, the light-emitting device 1E emits white light.

Seventh Embodiment

A seventh embodiment of the present invention will then be described.

Figure 8:
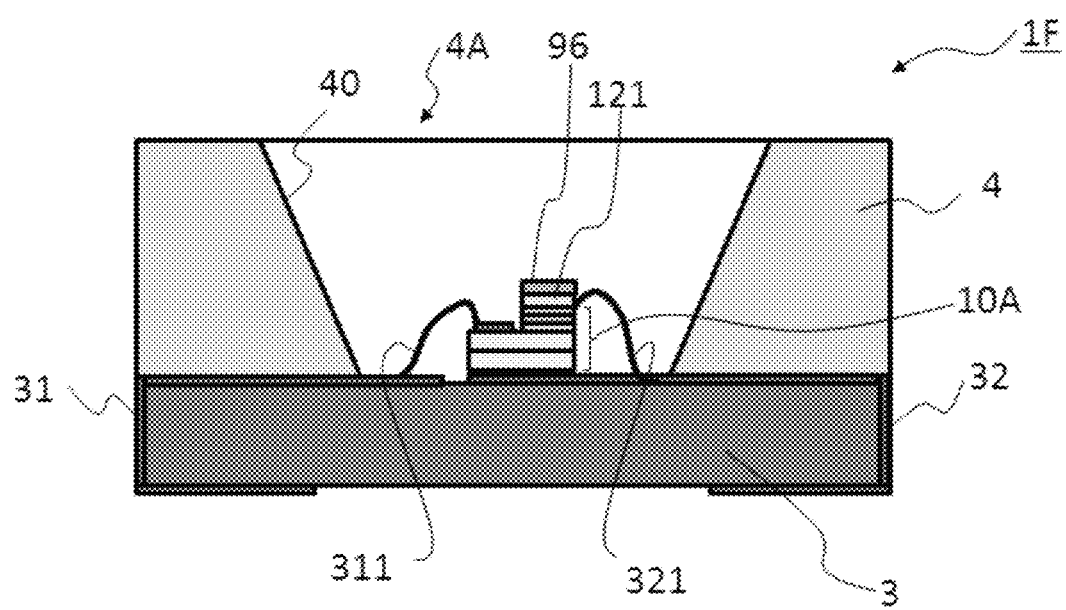
FIG. 8 is a cross-sectional view of the light-emitting device according to a seventh embodiment.

FIG. 8 is a cross-sectional view of a light-emitting device 1F according to a seventh embodiment. As shown in FIG. 8, this embodiment is the same as the composition of the second embodiment, except that a UV-excited blue light-emitting material 96 is disposed on the UV-excited yellow light-emitting material 121 on the UV light-emitting diode 10A. The description of the components of the light-emitting device having the same function and structure as those of the light-emitting device described previously will be omitted, with the same signs allotted to them, and different structures only will mainly be described.

In the light-emitting device 1F, the UV-excited blue light-emitting material 96 is disposed on the UV-excited yellow light-emitting material 121 on the UV light-emitting diode 10A. This structure allows the UV-excited yellow light-emitting material 121 to emit yellow light by a part of the UV light from the UV light-emitting diode 10A, while the UV-excited blue light-emitting material 96 emits the blue light by the rest of the UV light from the UV light-emitting diode 10A. Since the blue color and the yellow color are in complementary color relation, the light-emitting device 1E emits the white light.

Eighth Embodiment

An eighth embodiment will then be described.

Figure 9:
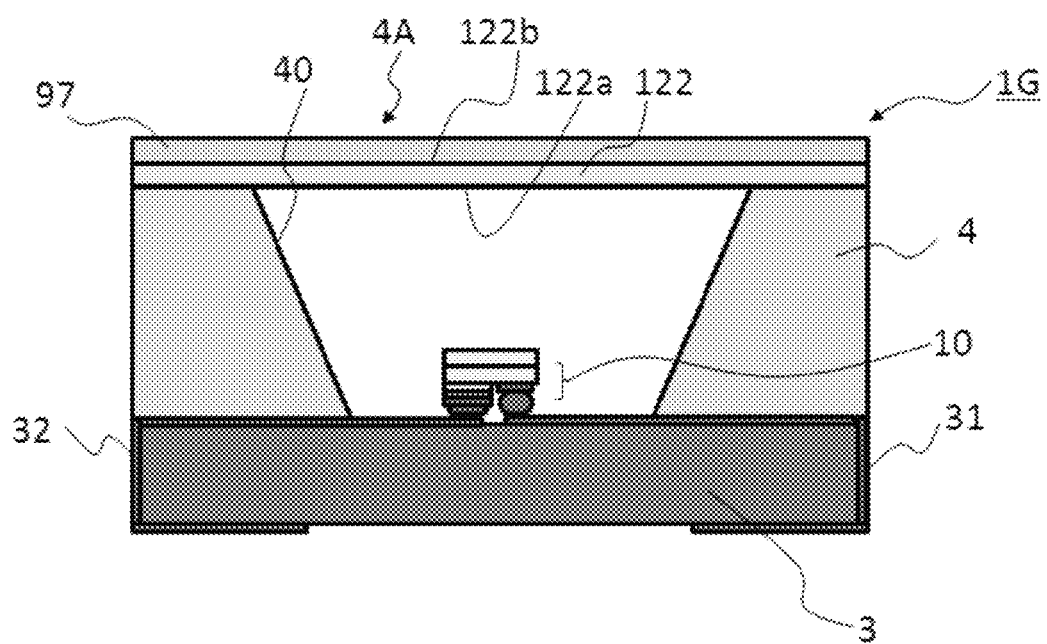
FIG. 9 is a cross-sectional view of the light-emitting device according to an eighth embodiment.

FIG. 9 is a cross-sectional view of a light-emitting device 1G in an eighth embodiment. As shown in FIG. 9, this embodiment is the same as the composition of the third embodiment, except that a UV-excited blue light-emitting material 97 is disposed on the UV-excited yellow light-emitting material 122. The description of the components of the light-emitting device having the same function and structure as those of the light-emitting device described previously will be omitted, with the same signs allotted to them, and different structures only will mainly be described.

In the light-emitting device 1G, the UV-excited blue light-emitting material 97 is disposed on the UV-excited yellow light-emitting material 122. This structure allows the UV-excited yellow light-emitting material 122 to emit yellow light by a part of the UV light from the UV light-emitting diode 10, while the UV-excited blue light-emitting material 97 emits the blue light by the rest of the UV light from the UV light-emitting diode 10. Since the blue color and the yellow color are in complementary color relation, the light-emitting device 1G emits the white light.

Ninth Embodiment

A ninth embodiment of the present invention will then be described.

Figure 10:
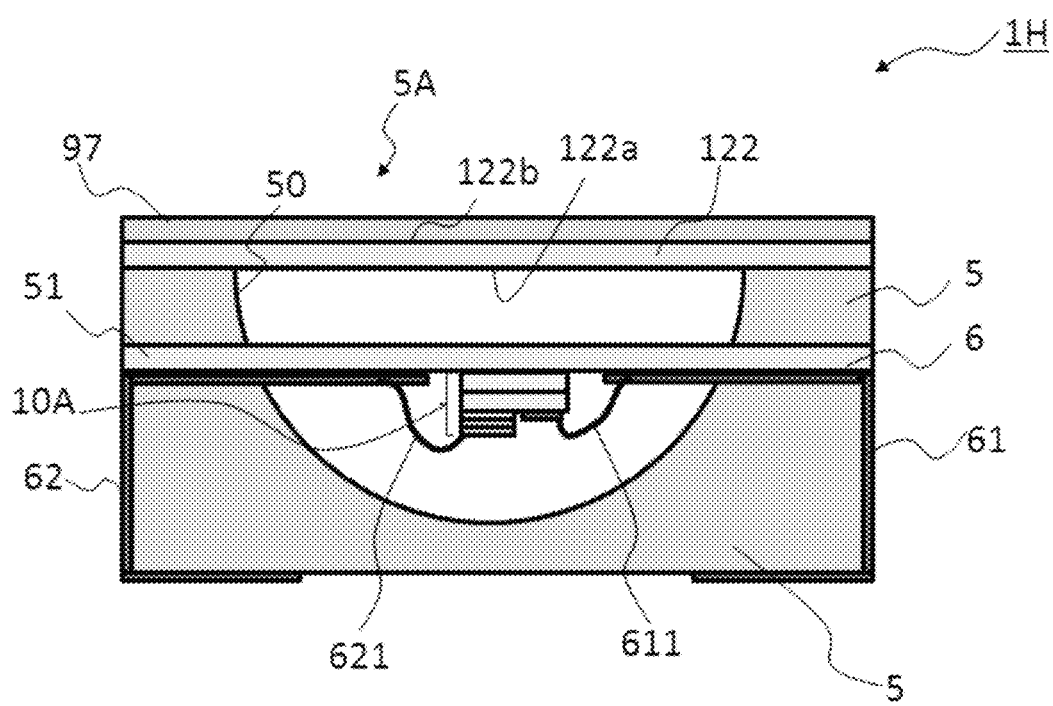
FIG. 10 is a cross-sectional view of the light-emitting device in a ninth embodiment.

FIG. 10 is a cross-sectional view of a light-emitting device 1H according to a ninth embodiment. As shown in FIG. 10, this embodiment is the same as the composition of the fourth embodiment, except that the UV-excited blue light-emitting material 97 is disposed on the UV-excited yellow light-emitting material 122. The description of the components of the light-emitting device having the same function and structure as those of the light-emitting device described previously will be omitted, with the same signs allotted to them, and different structures only will mainly be described.

In the light-emitting device 1H, the UV-excited blue light-emitting material 97 is disposed on the UV-excited yellow light-emitting material 122. This structure allows the UV-excited yellow light-emitting material 122 to emit the yellow light by a part of the UV light from the UV light-emitting diode 10A, while the UV-excited blue light-emitting material 97 emits the blue light by the rest of the UV light from the UV light-emitting diode 10A. Since the blue color and the yellow color are in complementary color relation, the light-emitting device 1H emits the white light.

Tenth Embodiment

A tenth embodiment of the present invention will then be described.

Figure 11:
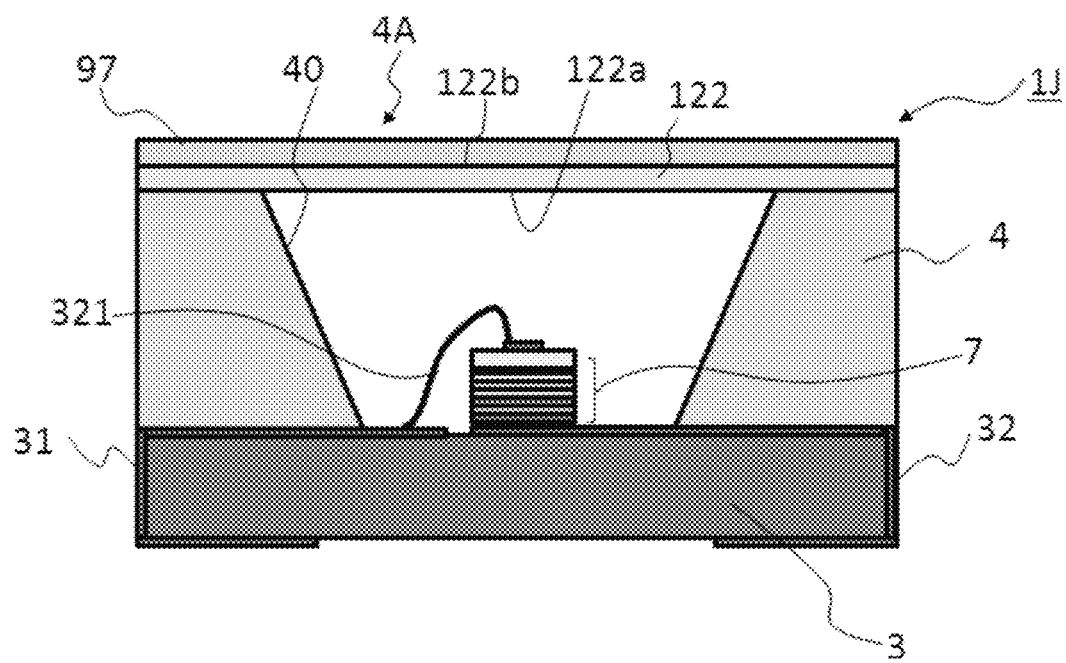
FIG. 11 is a cross-sectional view of the light-emitting device in a tenth embodiment.

FIG. 11 is a cross-sectional view of a light-emitting device 1J according to a tenth embodiment. As shown in FIG. 11, this embodiment is the same as the composition of the fifth embodiment, except that a UV-excited blue light-emitting material 97 is disposed on the UV-excited yellow light-emitting material 122. The description of the components of the light-emitting device having the same function and structure as those of the light-emitting device described previously will be omitted, with the same signs allotted to them, and different structures only will mainly be described.

In the light-emitting device 1J, the UV-excited blue light-emitting material 97 is disposed on the UV-excited yellow light-emitting material 122. This structure allows the UV-excited yellow light-emitting material 122 to emit the yellow light by a part of the UV light from the UV light-emitting diode 7, while the UV-excited blue light-emitting material 97 emits the blue light by the rest of the UV light from the UV light-emitting diode 7. Since the blue color and the yellow color are in complementary color relation, the light-emitting device 1J emits the white light.

In the sixth to the tenth embodiments of the present invention, the UV-excited blue light-emitting material 96, 97 is preferably a Ce:$R_2SiO_5$ single crystal (R is any one of Lu, Y, and Gd, or two or more of these elements). This is because the high-luminance light can be emitted, and at the same time processing into a specified size and the mounting to the UV light-emitting diode or light-emitting device is easy.

In the sixth to the tenth embodiments of the present invention, an example where the UV-excited blue light-emitting material 95, 96, 97 is mounted to the outside of the UV-excited yellow light-emitting material 2, 121, 122, namely on the side opposite the UV light-emitting diode 10, 10A, 7, was shown. However, the structure is not limited to this one, and the UV-excited blue light-emitting material 95, 96, 97 may be mounted inside the UV-excited yellow light-emitting material 2, 121, 122, namely on the side of the UV light-emitting diode 10, 10A, 7.

In the sixth to the tenth embodiments of the present invention, it is preferable that the plate thickness of the UV-excited yellow light-emitting material 2, 121, 122 and that of the UV-excited blue light-emitting material 95, 96, 97 are adjusted so that CIE chromaticity coordinate of the white light comes close to (0.33, 0.33), which improves color purity, turning bluish or yellowish white to pure white.

In the first to the tenth embodiments of the present invention, the structure where the UV-excited yellow light-emitting material 2, 121, 122 is disposed with respect to the UV light-emitting diode 10, 10A, 7 so that the light emitted from the UV light-emitting diode 10, 10A, 7 is introduced to the UV-excited yellow light-emitting material 2, 121, 122. This structure allows the emission from the UV light-emitting diode 10, 10A, 7 to excite the UV-excited yellow light-emitting material 2, 121, 122 efficiently, thereby obtaining high-luminance emission.

Note that the shapes of the light-emitting device are not limited to those described above. Also, a structure where a light-emitting device has a plurality of UV light-emitting diodes is also allowed. Furthermore, single crystal materials having different color tones, such as red phosphor, green phosphor, etc., may be used in combination. Furthermore, although the efficiency may decrease slightly, by crushing a phosphor single crystal in each color or in some of the colors, a powder phosphor may be obtained, and the obtained phosphor may be sealed using a binder or glass. The reason for this is that the phosphor powder obtained by crushing a single crystal is superior to the phosphor powder obtained by the ceramics synthesis method in all of the luminous efficiency, the quantum efficiency, and the temperature characteristics. At least, the characteristics of the phosphor can thus be improved.

The UV-excited yellow light-emitting material according to the embodiment of the present invention, the manufacturing method thereof, and light-emitting device are not limited to the embodiments described previously, but various modifications are allowed within the scope of the technical idea of the present invention. Specific examples using the optical material of this embodiment are shown below, but the present invention is not limited to those examples.

Eleventh Embodiment

Optical Isolator

An optical isolator material as the optical material of the present invention, the manufacturing method thereof, an optical isolator, and an optical processing apparatus will be described in detail by referring to the attached figures.

Figure 12:
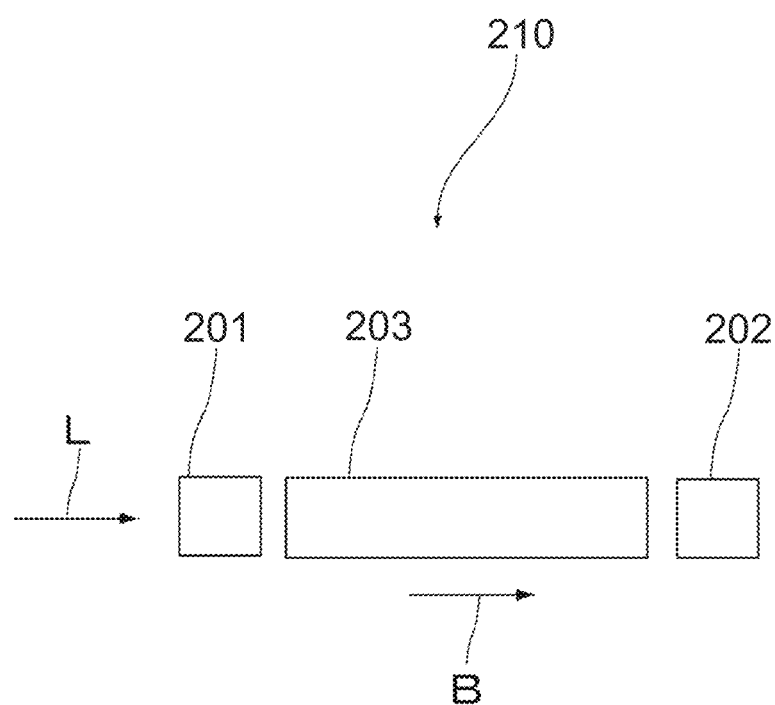
FIG. 12 is an outline drawing showing a typical optical isolator of the present invention as an eleventh embodiment.

FIG. 12 is an outline drawing of an embodiment of an optical isolator 210, which will be described as an eleventh embodiment of the present invention.

As shown in FIG. 12, the optical isolator 210 includes: a polarizer 201; analyzer 202; and a Faraday rotator (optical isolator material) 203 disposed between the polarizer 201 and the analyzer 202. In this case, the polarizer 201 and the analyzer 202 are disposed so that the transmission axis of each remains non-parallel to each other, forming a 45° angle, for example.

To the Faraday rotator 203, the magnetic flux density B is made to be applied in a direction from the polarizer 201 to the analyzer 202 for example, namely along the direction of introduction of light L. As a result of the application of the magnetic flux density B, the Faraday rotator 203 rotates the polarization plane of the light L having penetrated the polarizer 201, allowing the light to pass through the transmission axis of the analyzer 202.

Here, the structure of the optical isolator 210 is not limited to that described above. It is only necessary that the optical isolator has at least one of the polarizer 201 and the analyzer 202. Namely, another analyzer 202 may be used instead of the polarizer 201 so that two analyzers 202 are used. Another polarizer 201 may be used instead of the analyzer 202 so that two polarizers 201 are used. The above structure is called polarization dependent type, but the structure of the optical isolator 210 is not limited to this. For example, the polarization independent type may be adopted instead. The polarization independent type is an optical isolator 210 wherein a birefringent crystal wedge is disposed instead of the polarizer 210 and the analyzer 202. The polarized light is separated into an ordinary light and an extraordinary light by the birefringent crystal wedge on the incoming side of the light, these lights are made to pass through the Faraday rotator 203, and then introduced to the birefringent crystal wedge on the light-emitting side, where they are emitted as one light. However, the light in the opposite direction does not focus into one light eventually. This isolator can be used regardless of the state of incoming light as a highly versatile isolator.

<Optical Isolator Material (Faraday Rotator)>

The Faraday rotator 203 will then be described in detail.

The Faraday rotator 203 is made of an optical isolator material made of the optical material of the present invention. Namely, it is made of an oxide containing Ce. More specifically, the Faraday rotator 203 is made of the terbium cerium aluminum garnet type single crystal wherein a part of terbium (Tb) of a terbium aluminum garnet type single crystal is substituted by cerium (Ce). By having this structure, the optical isolator material 203 according to the embodiment of the present invention exhibits: (1) the transmittance of 79% or higher within the wavelength range from 500 nm to 1100 nm (further increase is obtained by coating); (2) the Verdet constant larger than that of TGG single crystal and TSLAG single crystal within the same wavelength range, and thus has the Faraday rotation angle exceeding that of TGG single crystal and TSLAG single crystal; and (3) thereby crystal diameter can be increased to 10 mm or larger.

In the optical isolator material 203 of the present invention, it is preferable that a part of terbium is substituted by cerium at a composition ratio to terbium of 0.01 mol % or higher but not exceeding 50 mol %.

In this optical isolator material 203, a part of aluminum may be substituted by scandium. Even if scandium is contained, the single crystal having the characteristics listed in (1) to (3) above can be obtained.

Furthermore, in this optical isolator material 203, a part of aluminum or scandium may be substituted by any one of terbium, cerium, yttrium, lutetium, ytterbium, and thulium, or two or more of these elements. Even if these elements are contained, the single crystal having the characteristics listed in (1) to (3) above can be obtained.

It is preferable that the optical isolator material 203 is represented by chemical formula (I) shown below.

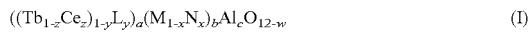

$$((Tb_{1-z}Ce_z)_{1-y}L_y)_a(M_{1-x}N_x)_bAl_cO_{12-w} \quad (I)$$

In the above chemical formula (I): L represents any one of Sc, Y, Lu, Yb, Tm, Mg, Ca, Hf and Zr, or two or more of these elements; M represents Sc; and N represents any one of Tb, Ce, Y, Lu, Yb, Tm, Mg, Ca, Hf, and Zr, or two or more of these elements. a, b, c, x, y, z, and w satisfy the following expressions.

$$2.5 \leq a \leq 3.5 \quad (II)$$

$$0 \leq b \leq 2.5 \quad (III)$$

$$2.5 \leq c \leq 5.5 \quad (IV)$$

$$0 \leq x \leq 1 \quad (V)$$

$$0 \leq y \leq 0.5 \quad (VI)$$

$$0.0001 \leq y \leq 0.5 \quad (VII)$$

$$0 \leq w \leq 0.5 \quad (VIII)$$

In the above chemical formula (I), a is normally 3, but can vary within the range from 2.5 to 3.5 depending on the type of constituent elements, generation of defects etc., and degree of crystal stability. b is normally 2, but can vary within the range from 0 to 2.5 depending on the type of constituent elements, generation of defects etc., and degree of crystal stability. Furthermore, c is normally 3, but can vary within the range from 2.5 to 5.5 depending on the type of constituent elements, generation of defects etc., and degree of crystal stability.

In the above chemical formula (I), N may be any one of Tb, Ce, Y, Lu, Yb, Tm, Mg, Ca, Hf, and Zr only, or in addition to the above one type of element, one or more types from Tb, Ce, Y, Lu, Yb, Tm, Mg, Ca, Hf, and Zr may be contained.

Provided that x falls within the above range, higher effect of substitution of M, namely the site of Sc, by N, namely any one of Tb, Ce, Y, Lu, Yb, Tm, Mg, Ca, Hf, and Zr, or two or more type of these elements, can be obtained, and thereby more stable crystal can be obtained and the growing is easy, compared to the case where x is larger than 1.

When y falls within the above range, distortion within the crystal can be suppressed, compared to the case where y does not fall within the above range. In this case, y is preferably as if there is a small value. In other words, it is preferable that the site of Tb and Ce is not substituted by L, namely any one of Sc, Y, Lu, Yb, Tm, Mg, Ca, Hf, and Zr, or two or more types of these elements, as far as possible. The smaller the value of y, the higher the Verdet constant can be.

z represents a value indicating the amount of substitution of Tb by Ce. The number of moles of Ce with respect to the total number of moles of Tb and Ce, namely the composition ratio of Ce preferably falls within the range from 0.01 mol % or higher but not exceeding 50 mol %, meaning that $0.0001 \leq x \leq 0.5$ is preferably satisfied. The higher the concentration of Ce, the larger the Verdet constant, but the crystal growth becomes difficult when the concentration is too high.

A part of aluminum or scandium may be substituted by a combination of elements exhibiting valences of $2^+$ and $4^+$, by a combination of elements such as $Ca^{2+}$, $Mg^{2+}$, $Zr^{4+}$, and $Hf^{4+}$, for example.

<Manufacturing Method of Optical Isolator Material (Faraday Rotator)>

A manufacturing method of the above optical isolator material (Faraday rotator 3) will then be described.

First, a method of growing Faraday rotator 203 made of the optical material of the present invention using a crystal pulling furnace will be described by referring to FIG. 1.

First, a powder raw material containing $Tb_4O_7$ powder, $Al_2O_3$ powder, and $CeO_2$ powder is prepared. In this case, if necessary, the powder raw material may further contain at least one of $Sc_2O_3$ powder, $Lu_2O_3$ powder, and $Y_2O_3$ powder. The above powder raw material can be obtained by mixing the $Tb_4O_7$ powder, $Al_2O_3$ powder, and $CeO_2$ powder by dry mixing. They may be mixed by wet mixing instead of dry mixing, and then dried.

The composition ratio of the $Tb_4O_7$ powder, $Al_2O_3$ powder, and $CeO_2$ powder in the powder raw material is determined based on the composition of the single crystal 26 to be grown.

The above powder raw material is packed in the crucible 21, and then high-frequency current is applied to the high-frequency coil 23. The crucible 21 is thus heated, and the temperature of the powder raw material within the crucible 21 is increased from a room temperature to a specified temperature. The specified temperature in this case is defined as a temperature at which the powder raw material can be dissolved. The powder raw material is thus dissolved, and the solution 24 is obtained. Next, the solution 24 is grown by the method of crystal growth from melt. Specifically, a rod-like crystal pulling shaft, namely the seed crystal 25, is provided. After allowing the tip of the seed crystal 25 to contact the solution 24, the seed crystal 25 is pulled up at a specified pulling speed, while it is rotated at a specified number of revolutions.

In this case, as the seed crystal 25, the garnet type single crystal such as yttrium aluminum garnet (YAG) is used, for example, and the rotation speed of the seed crystal 25 preferably falls within the range from 3 to 50 rpm, and more preferably from 3 to 10 rpm. The speed of pulling up the seed crystal 25 is preferably falls within the range from 0.1 to 3 mm/h, more preferably from 0.5 to 1.5 mm/h. It is preferable that pulling of the seed crystal 25 is performed in an inert gas atmosphere. As the inert gas, Ar, nitrogen, etc., can be used. To place the seed crystal 25 in an inert gas atmosphere, it is only necessary to feed an inert gas into a tightly closed housing at a specified flow rate while discharging it from the housing.

When the seed crystal 25 is pulled up in this way, a bulk grown crystal 26 represented by the chemical formula (I) is grown at the tip of the seed crystal 25. At this time, a single crystal 26 made of the terbium cerium aluminum garnet type single crystal wherein a part of Tb is substituted by Ce can be grown easily, and thus enlargement of the crystal 26 can be achieved.

Twelfth Embodiment

Optical Processing Apparatus

Figure 13:
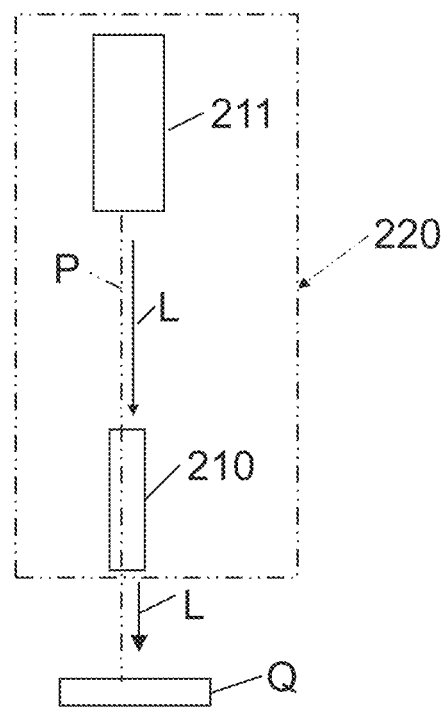
FIG. 13 is an outline drawing showing a typical optical processing apparatus using a single crystal according to the present invention.

An optical processing apparatus 220 according to a twelfth embodiment of the present invention will then be described in detail by referring to FIG. 13. In FIG. 13, the description of the same or equivalent components as those in FIG. 12 will be omitted.

FIG. 13 is an outline drawing showing an embodiment of the optical processing apparatus 220 of the present invention. As shown in FIG. 13, the optical processing apparatus 220 includes: a laser light source 211; and the optical isolator 210 disposed on the optical path P of the laser light L emitted from the laser light source 211. According to this optical processing apparatus 220, the laser light L emitted from the laser light source 211 is emitted through the optical isolator 210, and a body to be processed Q can be processed by the emitted light.

The typical optical isolator material 203 used for the optical isolator 210 is a terbium cerium aluminum garnet type single crystal, for example. As described above, (1) the transmittance within the wavelength range from 500 nm to 1100 nm is 79% or higher (can be increased by coating), (2) the Verdet constant within the same wavelength range is larger than that of TGG single crystal and TSLAG single crystal, and thus the Faraday rotation angle exceeding that of the TGG single crystal and TSLAG single crystal can be obtained within the same wavelength range, and (3) sufficient increase in size can be achieved.

It is therefore preferable to use Yb-doped fiber laser having oscillation wavelength of 1080 nm as the laser light source 211. However, the laser light source is not limited to this, and those having wavelength falling within the range from 500 nm to 1100 nm may be used. Consequently, the reflection return light can be cut efficiently to prevent degradation of the light source, and at the same time resistance to the high-power light can be maintained high during use. In addition, by downsizing the optical isolator 210, the optical processing apparatus 220 can also be downsized.

In the above embodiment, the optical isolator material 203 made of a terbium cerium aluminum garnet type single crystal is used for the optical isolator 210 of the optical processing apparatus 220. However, in addition to the optical isolator 210, by using the Faraday rotator 203, the optical isolator material is applicable to an optical magnetic sensor for observing the change in magnetic field by measuring the change in the Faraday rotation angle, and so on.

The optical isolator material 203, the manufacturing method thereof, the optical isolator 210, and the optical processing apparatus 220 of the present invention are not limited to the embodiments described above, but can be implemented by modifying the embodiments in various ways within the technical idea of the present invention. Specific examples of the embodiment will be described below, but the present invention is not limited to these examples.

EXAMPLE

Example 1: TCSAG 2% Sample

First, a raw material powder of terbium oxide ($Tb_4O_7$) having purity of 99.99%, a raw material powder of aluminum oxide ($Al_2O_3$) having purity of 99.99%, a raw material powder of scandium oxide ($Sc_2O_3$) having purity of 99.99%, and a raw material powder of cerium oxide ($CeO_2$) having purity of 99.99% were prepared.

The above powder raw materials were mixed by dry mixing to obtain mixed powder. In this case, Ce is made to be contained in the $CeO_2$ raw material powder at the ratio of 2 mol % to the total number of moles of Tb and Ce (100 mol %), namely at a molar ratio of $Tb_4O_7$:$CeO_2$:$Sc_2O_3$:$Al_2O_3$=1.47:0.12:2:3. The above mixed powder (powder raw material) was then packed in the Ir crucible 21. The crucible 21 is in a shape of a cylinder whose diameter is approximately 40 mm and height of approximately 40 mm.

The powder raw material was then heated from a room temperature to approximately 1950° C. to dissolve it and obtain a solution. To this solution, the tip of the yttrium aluminum garnet (YAG) seed crystal in a shape of a 3 mm×3 mm×70 mm square rod was made to contact, and the seed crystal was pulled up at a speed of 1 mm per hour while it was rotated at the rotation speed of 10 rpm to grow a bulk single crystal. The crystal was grown in an $N_2$ gas atmosphere, and the flow rate of $N_2$ gas was 1.0 (1/min.)

The transparent single crystal 26 having diameter of approximately 1.4 cm and length of approximately 4.5 cm (crystal A: Example 1 sample) was obtained in this way. The single crystal obtained in Example 1 may hereinafter be called Ce: TSAG or TCSAG 2%.

Figure 14:
FIG. 14 is a view showing a photo of crystal A (sample in Example 1).

The appearance of the TCSAG 2% single crystal was observed. The result is shown in FIG. 14, and will be described later. Crystal A was subjected to X-ray diffraction, and it was confirmed that a garnet type single crystal having a single phase had been obtained. It was also confirmed that a part of Tb had been substituted by Ce, and a part of Al had been substituted by Sc.

Furthermore, the TCSAG 2% single crystal was subjected to the chemical analysis by the inductively coupled plasma (ICP) to check the composition of the single crystal (ratio of number of atoms of Tb, Sc, Al, and Ce). As a result, it was confirmed that a single crystal having the composition represented by the following formula had been obtained: $Tb_{2.873}Ce_{0.018}Sc_{1.859}Al_{3.250}O_{12}$.

Figure 15:
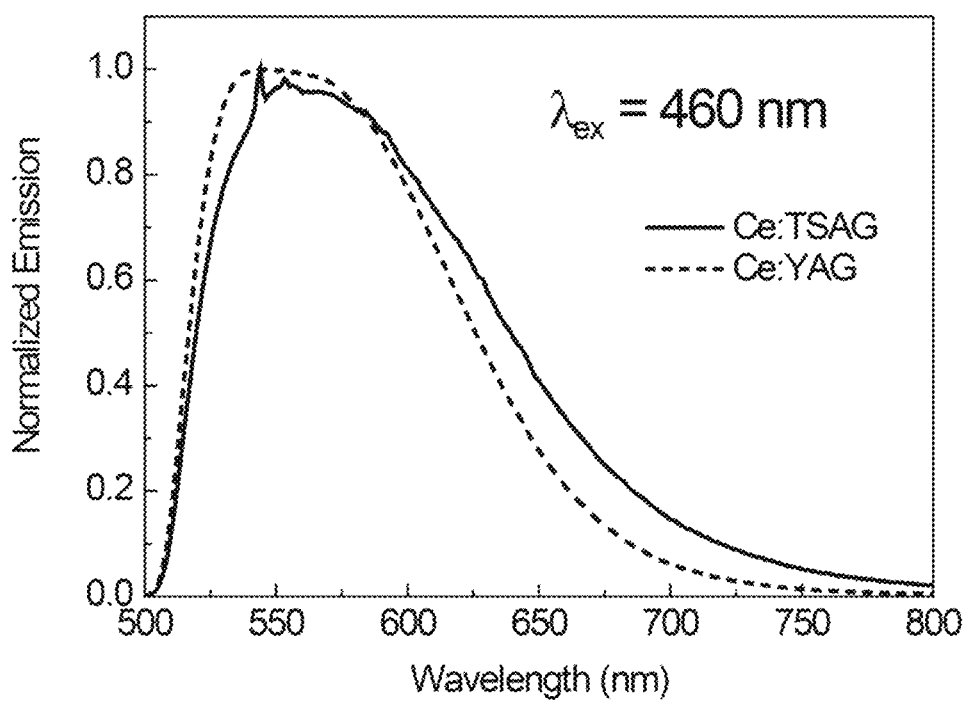
FIG. 15 is a view showing the fluorescence spectra of crystal A (sample in Example 1).
Figure 16:
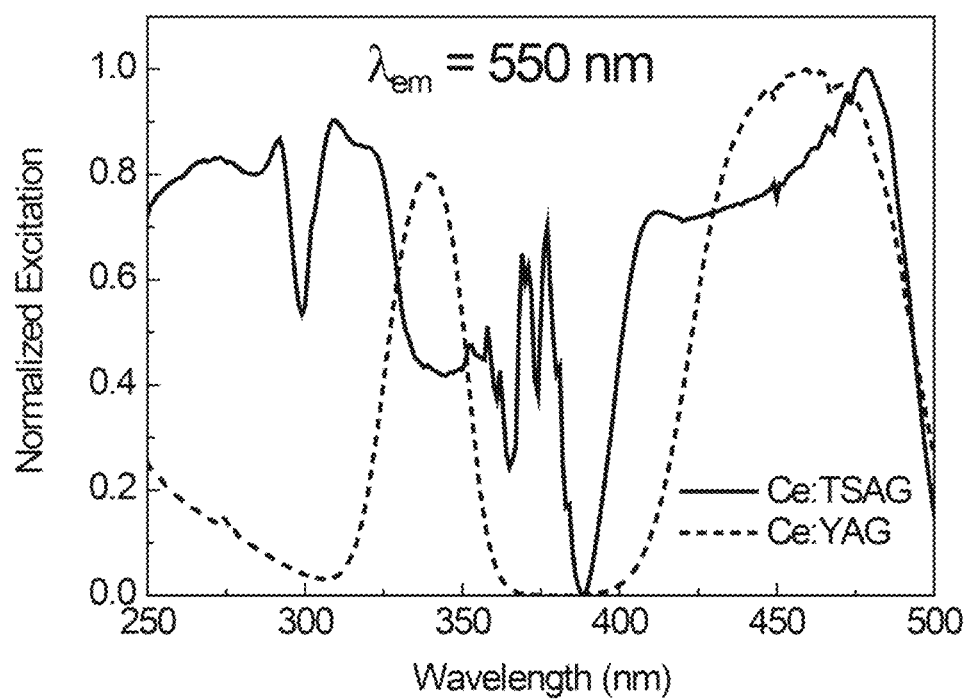
FIG. 16 is a chart showing the excitation spectra of crystal A (sample in Example 1).

The fluorescence spectra and the excitation spectra of this TCSAG 2% single crystal were measured. The measurement results are shown in FIGS. 15 and 16.

Figure 17:
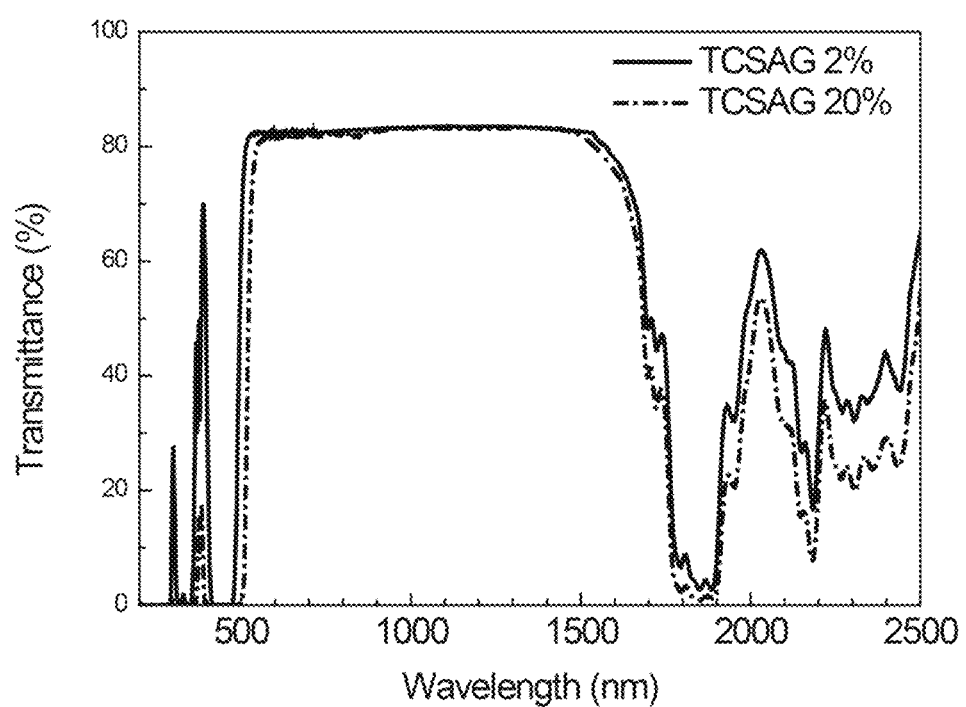
FIG. 17 is a chart showing the transmission spectra of TCSAG 2% single crystal in Example 1 and TCSAG 20% single crystal in Example 2.

The TCSAG 2% single crystal was cut out in a shape of a square rod in a size W [mm]×H [mm]×L [mm]=3.5 mm×3.5 mm×12 mm, and the transmittance of the cut crystal in a wide wavelength range (200 to 2500 nm) was measured. The result is shown in FIG. 17.

Then, the Faraday rotation angle of the TCSAG 2% single crystal cut out in a shape of a square rod in a wavelength range from 400 nm to 1100 nm was measured as follows. First, in a state where the single crystal 26 was not inserted between the polarizers, the polarizers were rotated to reach the quenching state.

In a state where the TCSAG 2% single crystal cut out in a shape of a square rod was placed between the polarizers and 0.42 T magnetic flux density was applied along the longitudinal direction of the single crystal, the light was introduced and the polarizers were rotated again to reach the quenching state.

Then, the difference between the rotation angle of the polarizers before the TCSAG 2% single crystal was inserted between the polarizers and the rotation angle of the polarizers after the TCSAG2% single crystal was inserted between the polarizers was calculated, and this difference of the angle was regarded as the Faraday rotation angle. The wavelength of the light source was varied within the wavelength range from 400 nm to 1100 nm.

Figure 18:
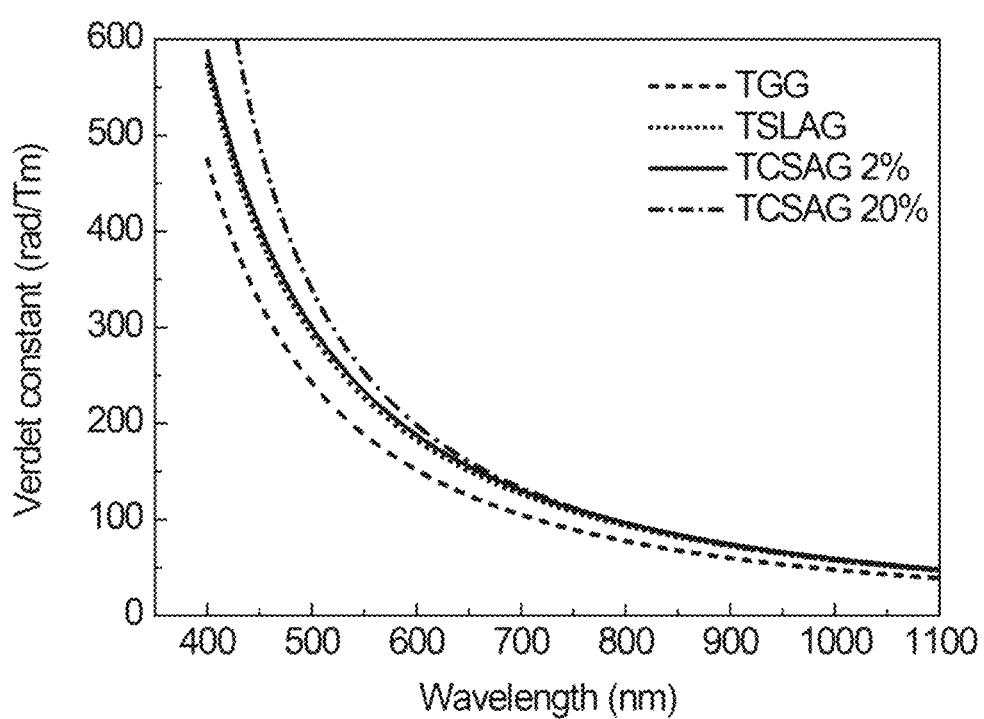
FIG. 18 is a chart showing the relation between Verdet constant and wavelength in Example 1 (TCSAG 2% single crystal), Example 2 (TCSAG 20% single crystal), Comparative Example 1 (TGG single crystal), and Comparative Example 2 (TSLAG single crystal).

Then from the Faraday rotation angle θ, the passing distance of light $L_{light}$, and the intensity of the magnetic field H, Verdet constant, which is the constant of proportionality γ in the expression represented as $θ=γ L_{light} H$ in the Faraday effect, was calculated. The result is shown in FIG. 18.

Example 2: TCSAG 20% Sample

The transparent single crystal 26 (TCSAG 20% single crystal) having diameter of approximately 1.3 cm and length of approximately 4.3 cm was obtained in the same manner as Example 1, except that $CeO_2$ raw material was made to contain Ce at the ratio of 20 mol % to the total number of moles of Tb and Ce (100 mol %) when the mixed powder was prepared.

The TCSAG 20% single crystal obtained in this way was subjected to X-ray diffraction, and it was confirmed that the garnet type single crystal having the single phase had been obtained. In addition, as a result of structural analysis of the obtained crystal B performed by X-ray diffraction, a part of Tb was confirmed to have been substituted by Ce, and a part of Al was confirmed to have been substituted by Sc.

Furthermore, the TCSAG 20% single crystal was subjected to the chemical analysis by inductively coupled plasma (CP) in the same manner as Example 1.

It was found that the single crystal 26 having the composition represented by the following expression had been obtained:

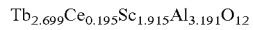
$Tb_{2.699}Ce_{0.195}Sc_{1.915}Al_{3.191}O_{12}$

The appearance of the TCSAG 20% single crystal was observed as in the case of Example 1. In the same manner as Example 1, the TCSAG 20% single crystal was cut out in a shape of a square rod, and its transmittance and Faraday rotation angle were measured. The results are shown in FIGS. 17 and 18.

Comparative Example 1

In Comparative Example 1, $Tb_3Ga_5O_{12}$ (TGG) manufactured by Fujian Castech Crystals, Inc. was used. As in the case of Examples 1 and 2, the TGG was cut out in a shape of a square rod, and its Faraday rotation angle was measured. The result is shown in FIG. 18.

Comparative Example 2

In Comparative Example 2, $Tb_3(Sc, Lu, Al)_5O_{12}$ (TSLAG) grown by the following method was used.

First, the terbium oxide ($Tb_4O_7$) raw material powder having purity of 99.99%, the aluminum oxide ($Al_2O_3$) raw material powder having purity of 99.99%, the scandium oxide ($Sc_2O_3$) raw material powder having purity of 99.99%, and the lutetium oxide ($Lu_2O_3$) raw material powder having purity of 99.99% were prepared.

The above raw powder materials were mixed by dry mixing to obtain mixed powder. At that time, $Lu_2O_3$ raw material powder was made to be contained at the ratio of 2.5 mol % to the total number of moles of $Sc_2O_3$ raw material powder and $Lu_2O_3$ raw material powder (100 mol %). The mixed powder was then packed in the Ir crucible 21. The crucible 21 is in a cylindrical shape and had the diameter of approximately 50 mm and the height of approximately 50 mm.

The powder raw material was then heated from a room temperature to 1950° C. to dissolve it and obtain a solution. Then the tip of an yttrium aluminum garnet (YAG) seed crystal in a shape of a 3 mm×3 mm×70 mm square rod was made to contact the solution, and the seed crystal was pulled up at the speed of 1 mm per hour while it was rotated at the rotation speed of 10 rpm to grow a bulk crystal. In this case, growing of crystal was performed in an $N_2$ gas atmosphere, and the flow rate of $N_2$ gas was 2.0 (1/min). A transparent single crystal having diameter of approximately 2.5 cm and length of approximately 12 cm was thus obtained. The TSLAG was cut out in a shape of a square rod as in the case of Examples 1 and 2, and its Faraday rotation angle was measured. The result is shown in FIG. 18.

FIG. 14 is a photo of the TCSAG 2% single crystal. According to FIG. 14, the TCSAG2% single crystal was transparent with a yellow tint. The same applies to the TCSAG 20% single crystal, which is not shown.

FIG. 15 shows the fluorescence spectrum of the TCSAG 2% single crystal. For comparison, the spectrum data of Ce: YAG is also shown. The shape of the fluorescence spectrum was similar to that of Ce: YAG. A yellow fluorescence spectrum having the emission peak wavelength around 550 nm was obtained.

FIG. 16 shows the excitation spectrum of the TCSAG 2% single crystal. For comparison, the spectrum data of Ce: YAG is also shown. The shape of the excitation spectrum was much different from that of the Ce: YAG. An excitation peak wavelength, which is not found in Ce:YAG, was found within the range from 360 to 390 nm.

From the above, the optical material of the present invention was found to be excited by ultraviolet light to become the yellow light-emitting material having the emission peak wavelength in the range from 500 nm to 630 nm.

FIG. 17 is a chart showing the relation between the transmittance and the wavelength, namely transmission spectrum, of the TCSAG 2% single crystal in Example 1 and of the TCSAG 20% single crystal in Example 2.

In FIG. 17, the transmission spectrum in Example 1 is shown by a solid line, and the transmission spectrum in Example 2 is shown by a dotted line. Both single crystals 26 in Examples 1 and 2 exhibited the transmittance of 79% or higher within the wavelength range from 500 to 1500 nm.

FIG. 18 is a chart showing the relation between the Verdet constant and the wavelengths in Example 1 (TCSAG 2% single crystal), Example 2 (TCSAG 20% single crystal), Comparative Example 1 (TGG single crystal), and Comparative Example 2 (TSLAG single crystal).

As shown in FIG. 18, Comparative Example 1 (TGG) exhibited the smallest Verdet constant within the wavelength range from 400 to 1100 nm. Comparative Example 2 (TSLAG) exhibited the second smallest Verdet constant after TGG within the wavelength range from 400 to 1100 nm. Example 1 (TCSAG2%) exhibited the Verdet constant slightly larger than that in Comparative Example 2 (TSLAG). Example 2 (TCSAG20%) exhibited the Verdet constant larger than any of Comparative Example 1 (TGG), Comparative Example 2 (TSLAG), and Example 1 (TCSAG 2%) within the wavelength range from 500 to 1100 nm.

The result as shown in FIG. 18 confirms the following: (1) Both of the single crystals 26 in Examples 1 and 2 made of a terbium cerium aluminum garnet type single crystal, wherein a part of Tb is substituted by Ce, exhibited transmittance of 79% or higher within the wavelength range from 500 to 1500 nm. In other words, the high transmittance was maintained within the range around 1080 nm.
(2) The Verdet constants of the single crystals 26 in Examples 1 and 2 were larger than those of TGG single crystal and TSLAG single crystal within the wavelength range from 500 to 1100 nm.
(3) In Examples 1 and 2, the large and transparent single crystals 26 having diameter of approximately 1.3 to 1.4 cm and length of 4.3 to 4.4 cm were obtained.

From the results described above, it was found that terbium cerium aluminum garnet type single crystal wherein a part of Tb is substituted by Ce had the Faraday rotation angle exceeding those of the TGG single crystal and the TSLAG single crystal at the wavelength of 1080 nm. Consequently, the present invention is preferable as the single crystal for the optical isolator of the optical processing apparatus 220 that uses the Yb-doped fiber laser having the oscillation wavelength of 1080 nm.

The optical isolator material 203 of the present invention can be made sufficiently large by the terbium cerium aluminum garnet type single crystal as an example. Consequently, the obtained single crystal 26 can be cut into a large number of single crystals 26, which reduces the cost of the optical isolator 210. Furthermore, since Lu, which is expensive, is not used, the raw material cost can be reduced to lower than that of TSLAG.

Example 3: Fabrication and Evaluation of the Yellow Light-Emitting Device

First, the UV light-emitting diode having the AlGaN layer as the emission layer was prepared. Then by dicing the TCSAG 2% single crystal manufactured in Example 1 on the surface perpendicular to the axial direction, the TCSAG 2% single crystal plate in a circular shape in planer view was fabricated. Then, these single crystal plate cut out in a size matching to the size of the second main surface of the diode substrate of the UV light-emitting diode. The cut TCSAG2% single crystal plate was then bonded to the second main surface of the diode substrate of this UV light-emitting diode. Electrodes of the UV light-emitting diode were bonded to the wiring part formed on the ceramic substrate via bumps.

The light-emitting device in Example 3 having the structure as shown in FIG. 2 was fabricated by the processes described above. By energizing it from the wiring part, the emission of high-luminance yellow light was obtained.

Example 4: Fabrication and Evaluation of the White Light-Emitting Device

First, the UV light-emitting diode having the AlGaN layer as the emission layer was prepared. Next, by dicing the TCSAG 2% single crystal manufactured in Example 1 on the surface perpendicular to the axial direction, a TCSAG 2% single crystal plate in a circular shape in planer view was fabricated. Then, these single crystal plate cut out in a size matching to the size of the second main surface of the diode substrate of the UV light-emitting diode. The cut Ce: TSAG single crystal plate was then bonded to the second main surface of the diode substrate of this UV light-emitting diode. Next, a Ce: $Lu_2SiO_5$ (LSO) single crystal plate, which is a blue phosphor, was prepared, and then cut in a size matching to the second major surface of the diode substrate of the UV light-emitting diode. The cut LSO single crystal plate was bonded to this TCSAG 2% single crystal plate. Electrodes of the UV light-emitting diode were bonded to the wiring part formed on the ceramic substrate via bumps.

By the processes described above, the light-emitting device 1E in Example 4 having the structure as shown in FIG. 7 was fabricated. By energizing it from the wiring parts 31, 32, the emission of high-luminance white light was obtained.

Example 5: Optical Isolator and Optical Processing Apparatus

The TCSAG 2% single crystal 26 fabricated in Example 1 was used for the optical isolator 210 and the optical processing apparatus 220 in Example 5.

INDUSTRIAL APPLICABILITY

As described above, the optical material of the present invention can be used favorably as the UV-excited yellow light-emitting material having the emission peak wavelength within the range from 500 nm to 630 nm by being excited by the ultraviolet light. Such UV-excited yellow light-emitting material is applied to light-emitting devices. In addition, the optical material of the present invention can also be used favorably as the optical isolator material of the optical processing apparatus using the Yb-doped fiber laser having the oscillation wavelength of 1080 nm, and is applicable in the optical processing and optical device industries, etc. Furthermore, by measuring the change in the Faraday rotation angle by using a Faraday rotator, the present invention is also applicable to the optical magnetic sensor, etc. for observing the change in magnetic field.

What is claimed is:
1. An optical material, comprising: an oxide containing Ce, wherein the optical material is a cerium-doped terbium scandium aluminum garnet type single crystal;

wherein a part of the terbium of a terbium aluminum garnet type single crystal is substituted by cerium, and a part of the aluminum of the terbium aluminum garnet type single crystal is substituted by scandium.

2. The optical material as set forth in claim 1, wherein a ratio of number of moles of cerium to a total number of moles of the terbium and the cerium, namely a composition ratio of the cerium, is 0.01 mol % or higher but not exceeding 50 mol %.

3. The optical material as set forth in claim 1, wherein a composition ratio of the cerium is 5 mol % or lower.

4. The optical material as set forth in claim 1, wherein the part of the aluminum or a part of the scandium is substituted by any one of terbium, cerium, yttrium, lutetium, ytterbium, and thulium, or two or more of these elements.

5. The optical material as set forth in claim 4, wherein the part of the aluminum or the part of the scandium is substituted by a combination of elements exhibiting valences of $2^+$ and $4^+$.

6. The optical material as set forth in claim 1 represented by chemical formula (I) shown below:

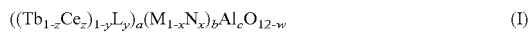

$$((Tb_{1-z}Ce_z)_{1-y}L_y)_a(M_{1-x}N_x)_bAl_cO_{12-w} \quad (I)$$

where: L represents any one of Sc, Y, Lu, Yb, Tm, Mg, Ca, Hf, and Zr, or two or more of these elements; M represents Sc; N represents any one of Tb, Ce, Y, Lu, Yb, Tm, Mg, Ca, Hf, and Zr, or two or more of these elements; and a, b, c, x, y, z, and w satisfy the following conditions (II) to (VIII):

$$2.5 \leq a \leq 3.5 \quad (II)$$

$$0 \leq b \leq 2.5 \quad (III)$$

$$2.5 \leq c \leq 5.5 \quad (IV)$$

$$0 \leq x \leq 1 \quad (V)$$

$$0 \leq y \leq 0.5 \quad (VI)$$

$$0.0001 \leq z \leq 0.5 \quad (VII), \text{ and}$$

$$0 \leq w \leq 0.5 \quad (VIII).$$

7. A method of manufacturing an optical material as set forth in claim 1 by a method of single crystal growth from melt, comprising:
heating and dissolving a powder raw material containing terbium oxide, aluminum oxide, scandium oxide and cerium oxide; and
pulling up a seed crystal from an obtained solution, thereby growing a cerium-doped terbium scandium aluminum garnet type single crystal.

8. The method of manufacturing the optical material as set forth in claim 7, wherein the single crystal is grown so that a composition ratio of cerium to a total number of moles of the terbium and the cerium becomes 5 mol % or lower.

9. A light-emitting device comprising:
a plate material using the optical material as set forth in claim 1 as a UV-excited yellow light-emitting material; and
a UV light-emitting diode having a light-emitting surface, wherein a surface of the plate material and the light-emitting surface are disposed so that they face each other.

10. The light-emitting device as set forth in claim 9, wherein an emission peak wavelength of the UV light-emitting diode falls within a range from 250 to 425 nm.

11. The light-emitting device as set forth in claim 9, wherein the UV-excited yellow light-emitting material is disposed, contacting the light-emitting surface of the UV light-emitting diode.

12. The light-emitting device as set forth in claim 9, wherein the UV-excited yellow light-emitting material is disposed, being apart from the light-emitting surface of the UV light-emitting diode.

13. The light-emitting device as set forth in claim 9, wherein a UV-excited blue light-emitting material is disposed, in addition to the UV-excited yellow light-emitting material.

14. The light-emitting material as set forth in claim 13, wherein the UV-excited blue light-emitting material is a $Ce:R_2SiO_5$ single crystal in which R represents any one, or two or more, of elements selected from Lu, Y, and Gd.

15. An optical isolator comprising: the optical material as set forth in claim 1, wherein the optical isolator is a polarization dependent type or a polarization independent type.

16. The optical isolator as set forth in claim 15, wherein the optical isolator is the polarization independent type.

17. An optical processing apparatus comprising: the optical isolator as set for in claim 15; and a laser light source, wherein the optical isolator is disposed on a light path of a laser light emitted from the laser light source.

18. The optical processing apparatus as set forth in claim 17, wherein an oscillation wavelength of the laser light source is 1080 nm.

* * * * *